(12) United States Patent
Bandyopadhyay

(10) Patent No.: US 12,217,890 B2
(45) Date of Patent: Feb. 4, 2025

(54) SUBWAVELENGTH ANTENNAS, DRIVERS, AND SYSTEMS

(71) Applicant: VIRGINIA COMMONWEALTH UNIVERSITY, Richmond, VA (US)

(72) Inventor: Supriyo Bandyopadhyay, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 394 days.

(21) Appl. No.: 17/440,974

(22) PCT Filed: Mar. 20, 2020

(86) PCT No.: PCT/US2020/023941
§ 371 (c)(1),
(2) Date: Sep. 20, 2021

(87) PCT Pub. No.: WO2020/191327
PCT Pub. Date: Sep. 24, 2020

(65) Prior Publication Data
US 2022/0165468 A1 May 26, 2022

Related U.S. Application Data

(60) Provisional application No. 62/830,604, filed on Apr. 8, 2019, provisional application No. 62/821,633, filed on Mar. 21, 2019.

(51) Int. Cl.
H01F 10/32 (2006.01)
H01P 3/08 (2006.01)
H03H 9/25 (2006.01)
H04L 27/12 (2006.01)
H04M 1/03 (2006.01)
B82Y 25/00 (2011.01)

(52) U.S. Cl.
CPC .......... H01F 10/324 (2013.01); H01P 3/081 (2013.01); H03H 9/25 (2013.01); H04L 27/12 (2013.01); H04M 1/03 (2013.01); B82Y 25/00 (2013.01)

(58) Field of Classification Search
CPC ......... H01F 10/324; H01P 3/081; H03H 9/25; H04L 27/12; H04M 1/03; B82Y 25/00; H01Q 1/364; H01Q 21/061; H10N 35/00; H10N 50/00
See application file for complete search history.

(56) References Cited

U.S. PATENT DOCUMENTS 9,391,262 B1 7/2016 Nikonov et al.
2012/0062220 A1 3/2012 Hoppensteadt et al.
(Continued)

OTHER PUBLICATIONS

Davis, S., Baruth, A. and Adenwalla, S., 2010. Magnetization dynamics triggered by surface acoustic waves. Applied Physics Letters, 97(23).*

(Continued)

Primary Examiner — Zhitong Chen
(74) Attorney, Agent, or Firm — WCF IP

(57) ABSTRACT

Embodiments generally relate to subwavelength antennas and, more particularly, extreme subwavelength antennas with high radiation efficiency. One embodiment and its derivatives achieve the objective of an extreme subwavelength dual acoustic and electromagnetic antenna by using spin-orbit torque in an array of nanomagnets.

5 Claims, 18 Drawing Sheets

(56) References Cited

U.S. PATENT DOCUMENTS

| | | |
|---|---|---|
| 2012/0267735 A1* | 10/2012 | Atulasimha ......... G11C 11/1675 257/E29.323 |
| 2012/0299175 A1 | 11/2012 | Tran |
| 2015/0097159 A1 | 4/2015 | Apalkov et al. |
| 2015/0303873 A1 | 10/2015 | Park et al. |
| 2017/0243917 A1 | 8/2017 | Manipatruni et al. |

OTHER PUBLICATIONS

Lin, H., Page, M.R., McConney, M., Jones, J., Howe, B. and Sun, N.X., 2018. Integrated magnetoelectric devices: Filters, pico-Tesla magnetometers, and ultracompact acoustic antennas. MRS bulletin, 43(11), pp. 841-847.*

And Lin, H., Zaeimbashi, M., Sun, N., Liang, X., Chen, H., Dong, C., Matyushov, A., Wang, X., Guo, Y., Gao, Y. and Sun, N.X., 2018, June. NEMS magnetoelectric antennas for biomedical application. In 2018 IEEE International Microwave Biomedical Conference (IM BioC) (pp. 13-15). IEEE.*

* cited by examiner

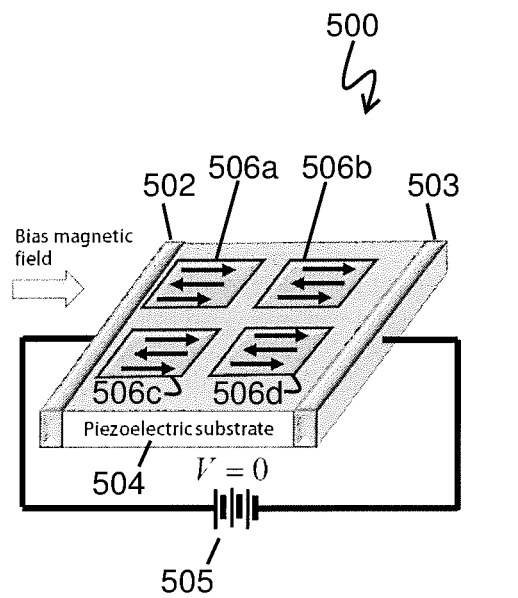
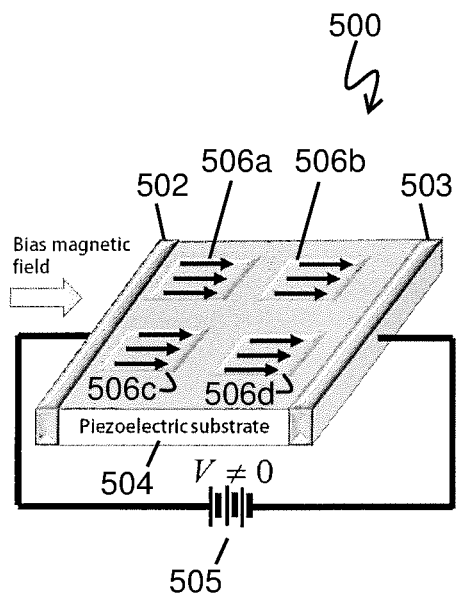
Figure 5A    Figure 5B
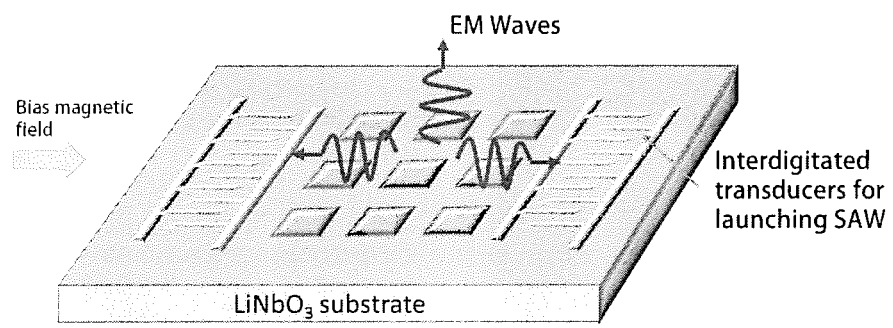
Figure 5C

SUBWAVELENGTH ANTENNAS, DRIVERS, AND SYSTEMS

FIELD OF THE INVENTION

Embodiments generally relate to subwavelength antennas and, more particularly, extreme subwavelength antennas with high radiation efficiency.

BACKGROUND

There is a strong interest in subwavelength antennas of all types (e.g., electromagnetic and acoustic) whose physical dimensions are much smaller than the wavelength of the radiation they emit. They can be miniaturized and integrated into a wide variety of modern communication systems, including but not limited to cell phones, embedded systems (e.g., wearable electronics), radio frequency identification (RFID) systems, medically implanted devices, and miniaturized communicators. However, such antennas typically have very poor radiation efficiency when they are excited at the radiation resonance (e.g. an electromagnetic antenna excited by an electromagnetic wave at electromagnetic resonance, or an acoustic antenna excited by an acoustic wave at acoustic resonance, etc.), because the radiation efficiency is typically bounded by $(l/\lambda)^2 [l<\lambda]$, where l is the antenna dimension and $\lambda$ is the wavelength of the emitted radiation. This limit is sometimes expressed as $A/\lambda^2 [A<\lambda^2]$, where A is the antenna emitting area and A is the wavelength of the emitted radiation.

Acoustic antennas with enhanced radiation efficiencies is an area of active research.

Landi et al. (M. Landi, J. Zhao, W. E. Prather, Y. Wu, L. Zhang, *Phys. Rev. Lett.* 2018, 120, 114301) studied an acoustic antenna predicated on the acoustic Purcell effect; it requires a cavity that modifies the acoustic density of states.

Zhang et al. (J. Zhang, Y. Chen, X. Liu, *Sci. Rep.* 2018, 8, 10049) studied a subwavelength acoustic antenna that uses Mie resonance and observed a 2.33-fold increase in the radiation intensity.

Zhang et al. (Z. Zhang, Y. Tian, Y. Wang, S. Gao, Y. Cheng, X. Liu, J. Christensen, *Adv. Mater.* 2018, 30, 1803229.) reported a 10-fold increase in the directivity of an acoustic antenna.

SUMMARY

This disclosure presents novel antennas and antenna systems which overcome the traditional radiation efficiency limit by a much larger factor than previously reported. Embodiments herein achieve this objective using various configurations of nanomagnet arrays.

One embodiment and its derivatives achieve the objective of an extreme subwavelength dual acoustic and electromagnetic antenna by using spin-orbit torque in an array of nanomagnets. Another embodiment and its derivatives achieve the objective by exciting an electromagnetic antenna at acoustic resonance instead of electromagnetic resonance. Still another embodiment and its derivatives achieve the objective using a topological insulator that interacts with a nanomagnet array.

A first embodiment involves a novel on-chip extreme subwavelength acoustic antenna whose radiation efficiency/intensity is at least 50 times larger than the theoretical limit for a resonantly driven antenna. The antenna comprises or is composed of magnetostrictive nanomagnets deposited on a piezoelectric substrate. The nanomagnets are partially in contact with a heavy metal (e.g., Pt) nanostrip. The antenna is driven (by a current source) using an alternating charge current passed through the heavy metal strip that is in contact with the array of nanomagnets. Passage of alternating current through the nanostrip exerts alternating spin-orbit torque on the nanomagnets because of the giant spin Hall effect in the heavy metal and periodically rotates (or flips) their magnetizations. This disclosure may use the term "change" to refer to rotation and flipping collectively. During the rotation, the magnetostrictive nanomagnets expand and contract, thereby setting up alternating tensile and compressive strain in the piezoelectric substrate underneath (that they are in elastic contact with). This leads to the generation of a surface acoustic wave in the substrate and makes the nanomagnet assembly act as an acoustic antenna. The period of the alternating charge current exceeds the time required to rotate the magnetization of the nanomagnets through a significant angle. So long as this requirement is met, the magnetizations of the nanomagnets rotate periodically with sufficient amplitude (or flip periodically) and emit an electromagnetic wave in addition to the acoustic wave. In an alternative embodiment, a topological insulator film delivers the spin-orbit torque to an array of nanomagnets instead of a heavy metal strip.

The examples show measured radiation efficiency≈1% of such an acoustic antenna at the detected frequency, while the wavelength to antenna dimension ratio was ≈67:1. This contrasts sharply with a standard antenna driven at acoustic resonance, the efficiency of which would have been limited to ≈$(1/67)^2$=0.02%. The acoustic antenna exemplified herein beat that limit by ≈50 times via actuating the antenna not at acoustic resonance, but by using a completely different mechanism involving spin-orbit torque originating from the giant spin Hall effect in Pt.

In yet another embodiment, an electromagnetic antenna is actuated by causing magnetization oscillations in magnetostrictive nanomagnets deposited on a piezoelectric substrate by launching a surface acoustic wave in the substrate. Different SAW frequencies are usable to cause the array to radiate at any frequency up to a predetermined limit, e.g., up to 1 GHz. This novel actuation mechanism allows for an extreme subwavelength electromagnetic antenna with a radiation efficiency over $10^5$ times larger than the limit for an electromagnetic antenna actuated by an electromagnetic wave and operated at electromagnetic resonance. The array of nanomagnets define an emitting area (A) and, when driven, radiate an electromagnetic wave of a wavelength ($\lambda$), wherein the ratio $A/\lambda^2$ is on the order of $10^{-9}$.

Antennas such those disclosed by or based on the present disclosure have applications in many areas such as miniaturized speakers, micro electromechanical (MEMS) devices, acoustic mapping and analysis of biological specimens in a biochip or biosensor, etc.

BRIEF DESCRIPTION OF THE DRAWINGS

FIGS. 5A and 5B show an extreme subwavelength antenna implemented with antiferromagnetic island on a piezoelectric substrate.

FIG. 5C shows an acoustic-to-electromagnetic converter where stress is generated with a surface acoustic wave (SAW).

DETAILED DESCRIPTION

Figure 1:
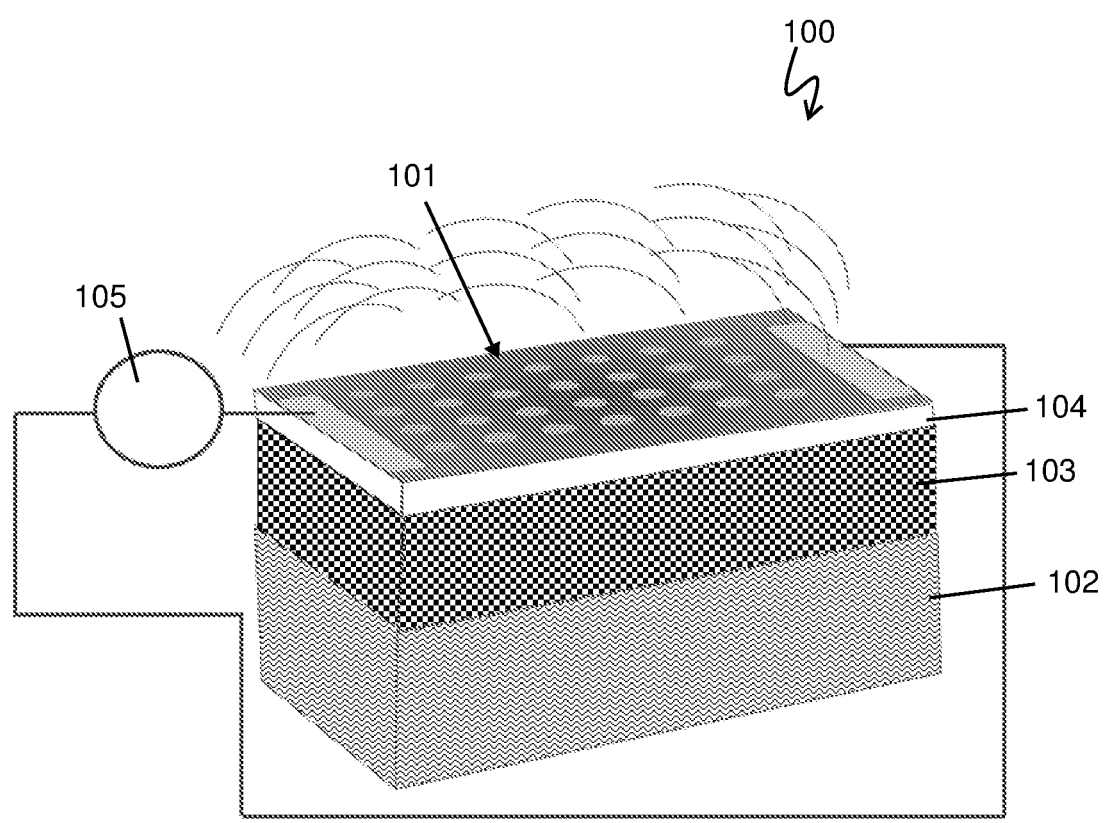
FIG. 1 is an extreme subwavelength antenna system comprising an array of nanomagnets.

FIG. 1 shows an antenna system 100. The system 100 comprises an array 101 of nanomagnets over a substrate 102. One or more additional films or materials 103, 104, etc. may lie between the substrate 102 and the array 101. Alternatively, the array 101 (and the nanomagnets thereof) may be in direct contact with the substrate 102. In this disclosure, "nanomagnets" means a ferromagnetic material of a few tens to a few hundreds of nanometer dimensions (e.g., between 20 and 500 nm in the largest dimension). The nanomagnets are two-phase multiferroic, i.e. they are magnetostrictive and are in elastic contact with a piezoelectric material. Alternatively, they could be magnetostrictive and in electrical contact with a heavy metal. One or more additional films may be interposed between the nanomagnet and heavy metal. "Heavy metals" means metals and other materials that can sustain a current flow and exhibit strong spin-orbit coupling. Passage of current through a heavy metal exerts a spin-orbit torque on the nanomagnet that they are in contact with. The magnetizations of the multiferroic nanomagnets (that is to say, the orientations or directions of their polarizations) may be changed by an electric field applied on the piezoelectric component of the multiferroic nanomagnet that exerts a strain on the nanomagnets. The magnetizations of nanomagnets in electrical contact with a heavy metal can be changed by passing electric current through the heavy metal that results in the exertion of a spin-orbit torque on the nanomagnets. If the electric field or the current oscillates in time, then so will the magnetizations. These oscillations radiate electromagnetic waves, thereby implementing an electromagnetic antenna that transmits electromagnetic waves.

Because the radiation is caused by oscillating magnetizations and not oscillating charges, the antenna's radiation efficiency can beat the $(l/\lambda)^2$ limit. At the same time, these magnetization oscillations make the nanomagnets expand and contract periodically, which causes a periodic strain on the substrate underneath. This generates a surface acoustic wave in the substrate, making the system also act as an acoustic antenna that transmits acoustic waves.

The system can also act as a receiving antenna. If an electromagnetic wave is incident on the nanomagnets, it will make their magnetizations oscillate, which will generate periodic spin pumping into the heavy metal and hence an alternating voltage across it because of the inverse spin Hall effect. In this case, the array of nanomagnets acts as a receiving antenna. Similarly, if an acoustic wave is incident on the nanomagnets, the nanomagnets will respond to the wave by periodically expanding and contracting, which will make their magnetizations oscillate due to the inverse magnetostriction effect and the resulting spin pumping into the heavy metal will cause an oscillating voltage owing to the inverse spin Hall effect. Thus, the array can also act as a receiving acoustic antenna.

The array 101 of nanomagnets functions as the antenna element of system 100. Depending on the specific configuration, the array 101 may transmit a signal, receive a signal, or both transmit and receive. The term "array" as used herein may refer to a single array or multiple arrays. Thus "an array" may comprise a plurality of arrays. Generally the smallest transmitting or receiving element of an array is a nanomagnet.

Antenna system 100 further comprises a module 105. Module 105 may be a transmitter, a receiver, or a transceiver. Module 105 may be configured to deliver power to or near the array 101. Module 105 may be configured to control the intensity, waveform, frequency, or amplitude of signals sent to the array 101 and emitted from the array 101. Module 105 is configured or configurable to periodically change magnetizations of the nanomagnets such that the array 101 emits one or more waves (one or more forms of radiation). In addition or in the alternative, module 105 is configured or configurable to filter, convert, and/or process a signal detected by array 101.

The antenna system 100 may be configured to transmit (emit) electromagnetic and/or acoustic waves. The antenna system 100 may be configured to receive electromagnetic and/or acoustic waves, converting such incoming signal to an electrical signal such as a current or voltage that varies based on a predetermined signal or message content.

The individual nanomagnets as illustrated in FIG. 1 are elliptical in shape. Different embodiments may have differently shaped nanomagnets. That is, an array 101 may have nanomagnets which are circular, elliptical, square, rectangular, polygonal, or any of variety of other shapes. The shape may affect the direction of the poles and may be selected to control the propensity of the nanomagnet to flip or rotate under predetermined environmental conditions, e.g., the strength of an applied electric or magnetic field.

Figure 2A:
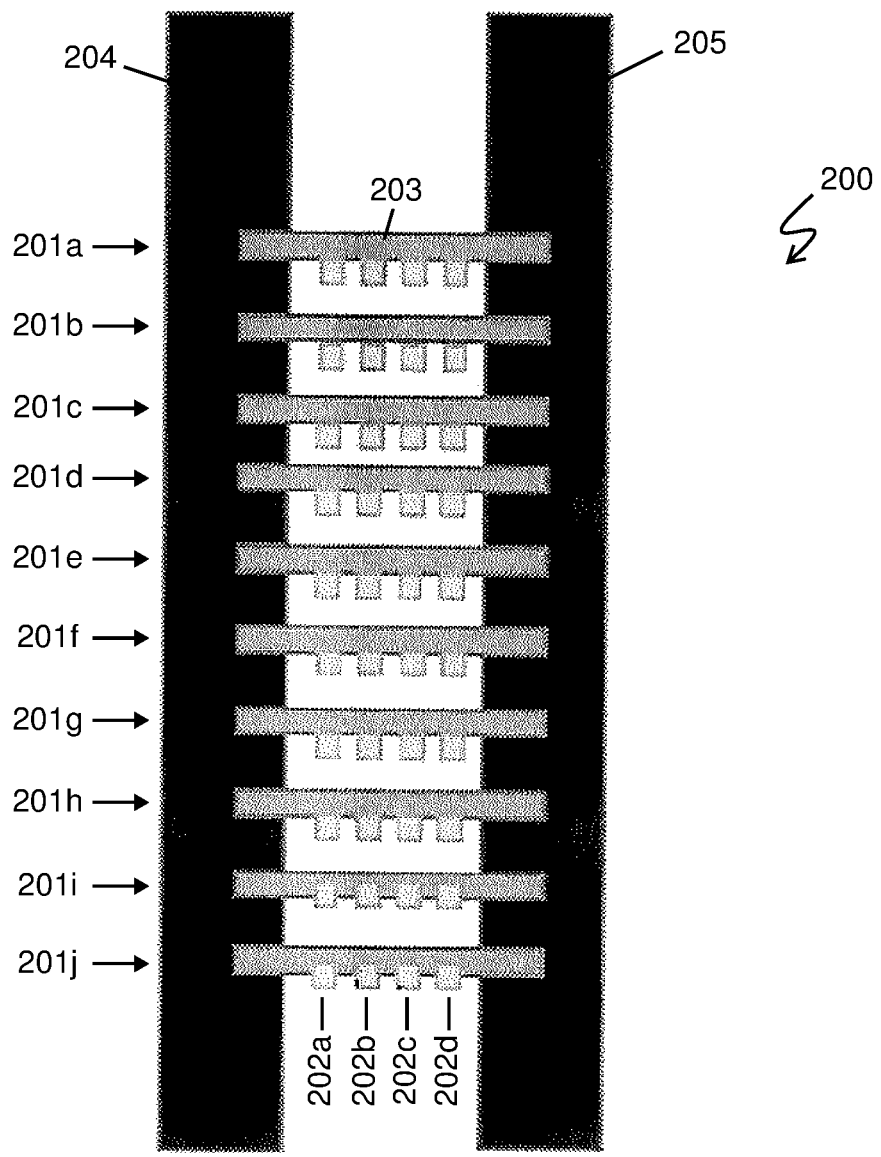
FIG. 2A is a nanomagnet array comprising rows of nanomagnets.

FIG. 2A shows another array 200 of nanomagnets. The array comprises a plurality of rows (which may be called columns depending on the reference frame). As illustrated FIG. 2A shows ten rows 201a through 201j, but embodiments may have significantly more than ten rows, e.g., hundreds or thousands of rows. Each row comprises a plurality of nanomagnets. As illustrated FIG. 2A shows four nanomagnets per row, e.g., row 201j has nanomagnets 202a, 202b, 202c, and 202d. To avoid overcrowding FIG. 2A, only the nanomagnets of row 201j are labeled. Embodiments may however have tens, hundreds, thousands, or more nanomagnets per row (or column). The nanomagnets of any one row are collectively in contact with a heavy metal strip 203. To avoid overcrowding FIG. 2A, only the heavy metal strip 203 of row 201a is labeled, but each row has a separate heavy metal strip. All of the heavy metal strips 203 are electrically connected with conductive contacts 204 and 205. The radiation from the antenna may be increased or decreased by respectively increasing or decreasing the number of nanomagnets in the array.

Figure 2B:
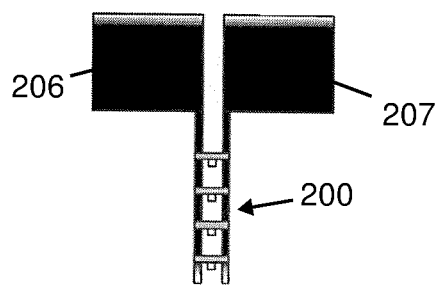
FIG. 2B is the nanomagnet array of FIG. 2A at a different zoom.

FIG. 2B shows a zoomed out portrayal of the array 200. At this zoom only four rows are distinguishable. FIG. 2B shows that conductive contacts 204 and 205 are respectively conductively connected with electrodes 206 and 207. The connection to successively larger conductive elements may be used to provide for the connection of the antenna array with other circuitry elements. As a reminder of scale of the illustrated elements, each nanomagnet may be, for example, only 100-500 nm in length and/or 100-500 nm in width.

Figure 3:
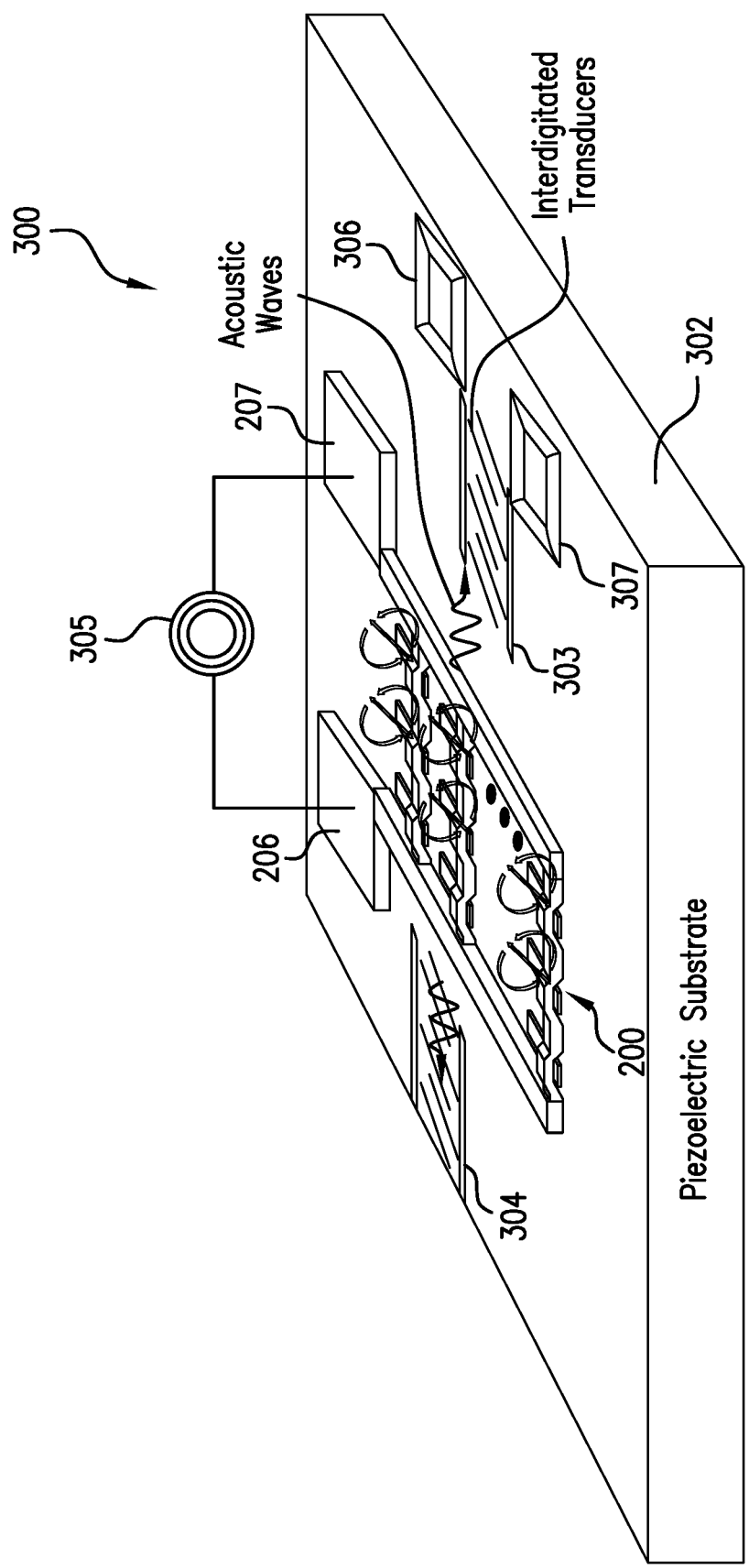
FIG. 3 is an antenna system configured as an acoustic antenna.

FIG. 3 is a schematic that incorporates the exemplary array 200 into a larger system 300 that includes both transmitting and receiving elements for respectively emitting and detecting transmission signals which are surface acoustic waves (SAWs). The substrate 302 is a piezoelectric substrate and the nanomagnets are magnetostrictive. The nanomagnets and substrate 302 are arranged with respect to one another such that physical forces in one transfer or are transferable to the other. Generally this is most readily achieved by the nanomagnets and substrate 302 being in direct physical contact with one another. However, some embodiments may have one or more materials (e.g., layers, films) partially or completely between the piezoelectric substrate and the nanomagnets.

In FIG. 3 the array 200 is only illustrated with three rows for simplicity of illustration. As discussed above, the actual number of rows may be tens, hundreds, or thousands. The number of rows may be configured according to the signal strength desired or required of the antenna as determined prior to manufacture. Generally, more nanomagnets, and thus more rows, corresponds with greater emitted signal strength (or sensitivity to received signals). The electrodes 206 and 207 are connected to a driver 305 which may comprise or else is connected to an AC source. The electrodes 206 and 207 are conductive traces and may be, for example, gold or aluminum. The driver 305 is configured to periodically change magnetizations of the nanomagnets of the array 200 such that the array emits one or more waves, in this case acoustic waves.

The receiving elements in system 300 are interdigitated transducers 303 and 304. Two receiving elements 303 and 304 are shown, but systems like system 300 may have only one or, alternatively, a plurality (e.g., 3, 4, 5, tens, or more). A transducer 303 is connected to electrodes 306 and 307 which facilitate electrical connection with downstream circuitry. FIG. 3 shows the antenna-transmitter system (comprising the nanomagnet array and driver) and the antenna-receiver system (comprising the interdigitated transducers) physically situated near one another. This proximity may be representative for some embodiments but particularly functions in FIG. 3 the illustrative objective of fitting both systems in the same drawing. In practice, the distance over which the signal is transmitted may vary substantially, depending on the particular use scenario. The distances over which a surface acoustic wave (SAW) can travel depends on the attenuation constant which, in turn, depends on the material in which the SAW propagates and also the crystallographic orientation along the direction of propagation. Typically, the attenuation constant in suitable materials is very small. Hence the SAW can easily propagate over several tens of cm (e.g., at least 50, 60, 70, 80, or 90 cm) without losing much signal strength. The direction of the SAW propagated by the nanomagnet array 200 is generally in all directions on the surface plane of the piezoelectric substrate 302. That is to say the exemplary antenna is omnidirectional in the plane of the piezoelectric substrate.

Figure 4A:
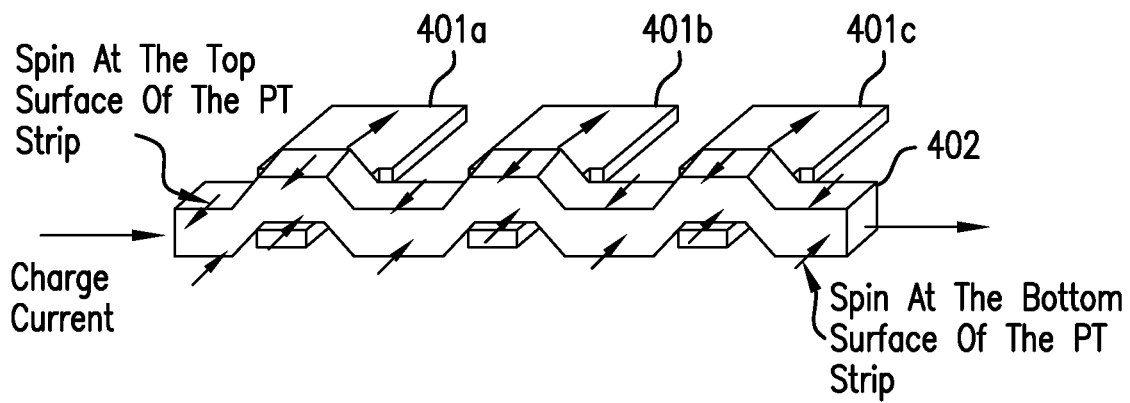
FIGS. 4A and 4B illustrate the principle of actuating an antenna by spin-orbit torque from a heavy metal nanostrip.
Figure 4B:
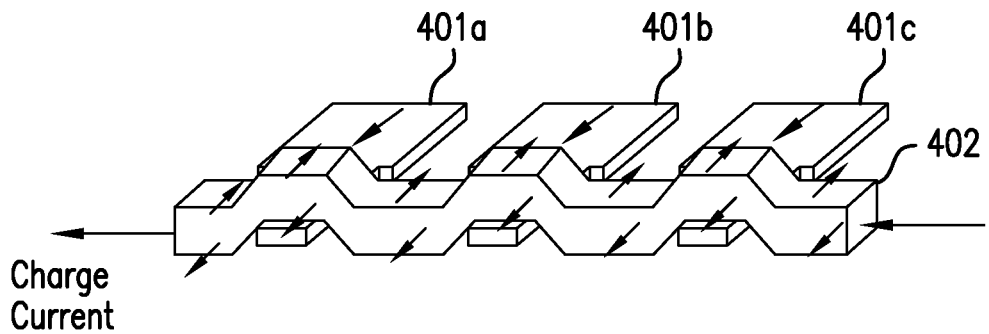

FIGS. 4A and 4B illustrate the mechanism by which the magnetizations of the nanomagnets are periodically changed, resulting in the emission of one or more waves. Each of FIGS. 4A and 4B show the same three nanomagnets 401a, 401b, 401c belonging to the same row of an array such as array 200 (see FIGS. 2A, 2B, and 3).

Figure 4C:
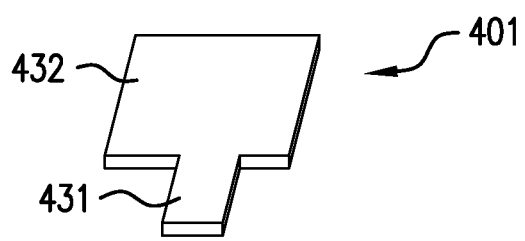
FIG. 4C shows an exemplary nanomagnet shape involving a main body and a ledge.

FIG. 4C shows a perspective view of a single nanomagnet 401, representative of nanomagnets 401a, 401b, and 401c. Each nanomagnet 401 comprises a ledge 431 and a remaining portion 432. The remaining portion 432 may be square, for example, with the ledge 431 being substantially smaller in surface area and volume than the remaining portion 432. Portions 431 and 432 may be a single body produced in a single step or by the same manufacturing steps (e.g., of a photolithographic process).

Returning to FIGS. 4A and 4B, a single heavy metal strip 402 is arranged across the ledge of each of the nanomagnets 401a, 401b, and 401c. That is to say, each ledge is underneath the heavy metal nanostrip. An exemplary heavy metal is platinum. The bulk of each nanomagnet (the portion 432) is outside the strip 402 and hence its expansion/contraction is not clamped by the nanostrip. Only the ledge is clamped.

FIG. 4A shows the application of a charge current to the heavy metal nanostrip in a first direction of current, whereas FIG. 4B shows the application of a charge current to the heavy metal nanostrip in a second direction of current, where the first and second directions are opposite. Both directions may be result of an applied alternating current. Thus in practice, the driver would periodically alternate the current between these two states. When a charge current is injected into the nanostrip, the top and bottom surfaces of the nanostrip become spin-polarized because of the giant spin Hall effect in the heavy metal (here, Pt). The two surfaces have antiparallel polarizations. The polarizations of spins in either surface depends on the direction of the current and changes sign when the current reverses direction. The accumulated spins in the bottom surface of the nanostrip 402 diffuse into the ledges 431 that they are in contact with, and from there into the remaining portion of the nanomagnets 401a, 401b, and 401c. This transfer exerts a spin-orbit torque on the nanomagnets 401a, 401b, and 401c and rotates their magnetizations. FIGS. 4A and 4B are labeled with a number of arrows to show the spin on top surfaces of the nanostrip 402, the bottom surfaces of the nanostrip 402, and in the nanomagnets 401a, 401b, an 401c.

When the driver reverses the direction of the injected charge current, the change in current reverses the spin polarization of the bottom surface of the nanostrip and hence rotates the magnetizations of the nanomagnets in the opposite direction because the spin-orbit torque will reverse direction. Generally, this will happen only as long as the period of the current is longer than the time of magnetization rotation. Thus, if the driver passes an alternating current through the nanostrip, it will rotate or flip the magnetizations of the nanomagnets periodically, as long as the frequency of the current is considerably smaller than the inverse of the spin rotation times of the nanomagnets. One or more of the shape, size, and material of the nanomagnets, the nanostrip, and the physical arrangement of the nanomagnets and nanostrips may be configured at the time of manufacture to set the threshold to a predetermined value.

The alternating rotation of the nanomagnets in the array causes the array to emit an electromagnetic wave, hence the system 300 in FIG. 3 will act as an electromagnetic antenna. At the same time, the nanomagnets will periodically expand and contract because they are magnetostrictive, thus executing a "breathing mode" oscillation. This will generate periodic strain in the piezoelectric substrate 302 underneath the nanomagnets and set up a SAW that is detectable with interdigitated transducers (IDTs). Thus, the system 300 acts as a dual electromagnetic and acoustic antenna. The driver 305 may be configured to modulate a frequency of the emitted wave solely by controlling a frequency of the alternating charge current.

The wavelength of the acoustic wave may be determined solely by the frequency of the alternating charge current (which is the dominant frequency of the generated acoustic wave) and the velocity of acoustic wave propagation in the piezoelectric substrate. Therefore, it has no relation to the size of the nanomagnets (antenna elements). The antenna elements may be much smaller than the size of the acoustic wavelength. The result is a subwavelength acoustic antenna with a radiation efficiency that exceeds the theoretical limit for an acoustic antenna excited at acoustic resonance.

From the physics perspective, electrical signals (photons) are used to generate acoustic waves (phonons). The antenna converts photons in the input (low-frequency electromagnetic) alternating signal applied to the Pt strip to magnons via the spin Hall effect (or spin-orbit torque) and then to phonons in the surface acoustic wave via magnetoelastic coupling, which are finally detected at the IDT. The overall efficiency of this three-step process is at least $\approx 1\%$.

Example 1 below show an extreme subwavelength acoustic antenna that emits acoustic waves (in addition to electromagnetic waves) with an efficiency of $\approx 1\%$. The antenna dimension was 67 times smaller than the acoustic wavelength. The antenna is not driven at acoustic resonance, thereby avoiding the expected efficiency limit. For instance, for an antenna 67 times smaller than the acoustic wavelength, the efficiency of such antenna if driven at acoustic resonance would be limited to $(1/67)^2 = 0.02\%$. The present embodiment overcomes that limit and achieves an efficiency of $\approx 1\%$, which is 50 times larger than the limit. This is achieved using a principle of actuation different from acoustic resonance. The antenna dimension can be made substantially smaller than $1/67$ times the wavelength with still reasonable radiation efficiency.

The excitation frequency (frequency of the electrical signal applied to the Pt nanostrip to produce the giant spin Hall effect) in Example 1 was around 3.6 MHz. The maximum allowable frequency (or alternately the minimum signal period) is determined by the time it takes for the nanomagnets' magnetizations to rotate over a significantly large angle. The signal period must exceed the latter time by a factor of e.g. $\approx 10$ to ensure that nearly all the nanomagnets have ample time to rotate their magnetizations through a large enough angle and produce a strain in the piezoelectric substrate underneath. The time taken by the magnetization to rotate through a large enough angle depends on the size, shape, nanomagnet material, and also the strength of the spin-orbit torque, which, in turn, is determined by the spin-orbit interaction strength in the heavy metal (in this case platinum) and the magnitude of the current injected into it. For reasonable values of these parameters, the switching time is estimated to be no less than $\approx 1$ ns. (Past simulations by the inventors based on the Landau-Lifshitz-Gilbert equation suggests that the switching time is on the order of 1 ns.) Of course, there will be distribution of the switching time because of defects in the nanomagnets, pinning sites, variations in shape and size, etc. As a result, some embodiments may use a safe estimate threshold for switching of 10 ns, which would then limit the maximum frequency to 100 MHz. This is high enough for many on-chip acoustic applications.

The system 300 of FIG. 3 was described above according to a configuration in which antenna array 200 transmitted a signal and IDTs 303 and 304 received the signal. In some embodiments, the nanomagnet array 200 may instead by configured as the receiving element. The transmitting element in such an arrangement may be another nanomagnet array like array 200, or else it may be IDTs. To recap, an antenna according to the present disclosure may be configured as a transmitting antenna, receiving antenna, or both. Antennas according to the present disclosure may furthermore be configured as an electromagnetic antenna, acoustic antenna, or both.

In FIG. 3, the IDTs 303 and 304 may be used as input ports, and the two terminals or electrodes 206 and 207 of the heavy metal strips may be used as output ports. An oscillating electrical signal applied at the input port produces an oscillating electrical signal at the output port because of reciprocity. The input signal at the IDT 304 or 303 launches a SAW in the substrate 302. The SAW in the substrate 302 periodically rotates the magnetizations of the magnetostrictive nanomagnets owing to the Villari effect. This results in periodic spin pumping into the heavy metal (e.g., Pt) lines, resulting in an alternating spin current which would have been converted into a charge current by the inverse spin Hall effect, resulting in an oscillating electrical signal across the heavy metal lines. However, to observe the reciprocal effect, the design should be such that sufficient spin pumping can occur. Here, the details of system 300 may differ from what is disclosed above in FIGS. 4A, 4B, and 4C. When configuring system 300 for optimal performance as an acoustic antenna that transmits a SAW, the exemplary nanomagnets 401 included ledges to avoid clamping. Such configuration may preclude sufficient spin pumping because a small section of the nanomagnets are in contact with the Pt strip. Therefore, the reciprocal effect is small in the arrangement of heavy metal strip and nanomagnets represented by FIGS. 4A, 4B, and 4C. Accordingly, for embodiments in which an array 200 of a system 300 is configured for receiving an acoustic wave and converting it to an electrical signal, the nanomagnets should have a larger overlap with the adjacent heavy metal strip for more efficient spin pumping.

The actuation of the nanomagnets as described in the preceding paragraph is similar for a configuration in which the array 200 is used for emitting an electromagnetic wave as a result of actuation by an acoustic wave. The physics underlying configuration of the array 200 as electromagnetic antenna actuated by an acoustic wave is a converse of the physics underlying the configuration of the array 200 as an acoustic antenna actuated by an alternating current that causes alternating spin-orbit torque. Configured as an electromagnetic antenna actuated by an acoustic wave, array 200 of system 300 converts phonons to magnons to photons in order to realize a subwavelength electromagnetic antenna implemented with magnetostrictive nanomagnets that were periodically strained with a surface acoustic wave.

Exciting the antenna at acoustic resonance instead of electromagnetic resonance allows for considerable miniaturization of the antenna. Since the acoustic wave velocity in many piezoelectric solids is roughly five orders of magnitude smaller than the speed of light in vacuum, the acoustic wavelength is five orders of magnitude smaller than the electromagnetic wavelength at the same frequency. Consequently $A/\lambda_{ac}^2 \sim 10^{10} \times A/\lambda_{EM}^2$, where A is the radiating area of the antenna, $\lambda_{ac}$ is the acoustic wavelength and $\lambda_{EM}$ is the electromagnetic wavelength.

The surface acoustic waves were also found to amplify the magnetization response of nanomagnets resonating in GHz frequencies, which may have different applications of its own. These extreme sub-wavelength antennas allow dramatic downscaling of communication systems and may open up new high frequency applications. They may also allow the miniaturization of two-dimensional phased array antennas for electronic beam steering with the entire array occupying an area much smaller than the square of the emission wavelength.

FIGS. 5A and 5B illustrate yet a further embodiment. Here a sub-wavelength electromagnetic antenna 500 is implemented with anti-ferromagnets that undergo a metamagnetic transition to a ferromagnetic state at a critical temperature. For example, FeRh is an antiferromagnet below 350 K temperature, but becomes a ferromagnet above that temperature. The transition temperature is suppressed to below room temperature using strain. Thus, by applying strain, antiferromagnetic FeRh is converted to ferromagnetic FeRh at room temperature.

In FIG. 5A, islands 506a, 506b, 506c, and 506d of anti-ferromagnetic material are on a piezoelectric substrate 504. Islands (of lateral dimensions such as 100 nm and thickness 5-10 nm) may be sputter deposited on a patterned piezoelectric substrate. The islands may be made of, for example, FeRh. The piezoelectric substrate may be LiNbO$_3$ for example. The antiferromagnetic state has no net magnetization.

In FIG. 5B a bias electric field is induced by an applied voltage from power source 505 applied between electrodes 502 and 503 on opposite sides of the substrate 504. Application of a voltage across the piezoelectric substrate strains the islands such that they undergo a metamagnetic transition to the ferromagnetic phase. The strain in the substrate 505 resulting from the bias field causes the islands 506a, 506b, 506c, and 506d to convert to a ferromagnetic state with orientations fixed in a common direction.

Application of an oscillating voltage to the piezoelectric periodically generates a magnetic field in the direction of the bias field, and this oscillating field will produce an electromagnetic wave. The islands 506a, 506b, 506c, and 506d thus become an extreme subwavelength electromagnetic antenna.

The highest frequency that is producible is limited by the piezoelectric response time of 10-100 ps and hence is between 10 and 100 GHz (a higher frequency than embodiments described above since we are relying on the metamagnetic transition and not the Giant Spin Hall Effect, spin diffusion and magnetic reversal of the nanomagnets). The electromagnetic wavelength at these frequencies is in the range 0.3-3 mm, while the antenna dimension is ≈100 nm, making the wavelength to antenna dimension ratio at least 3000:1.

FIG. 5C shows an acoustic-to-electromagnetic converter 500 where the stress is generated with a surface acoustic wave. To implement an antenna for lower frequencies (≈1 GHz), then the strain in the piezoelectric can also be produced by launching a surface acoustic wave of frequency ≈1 GHz in the substrate.

Figure 6:
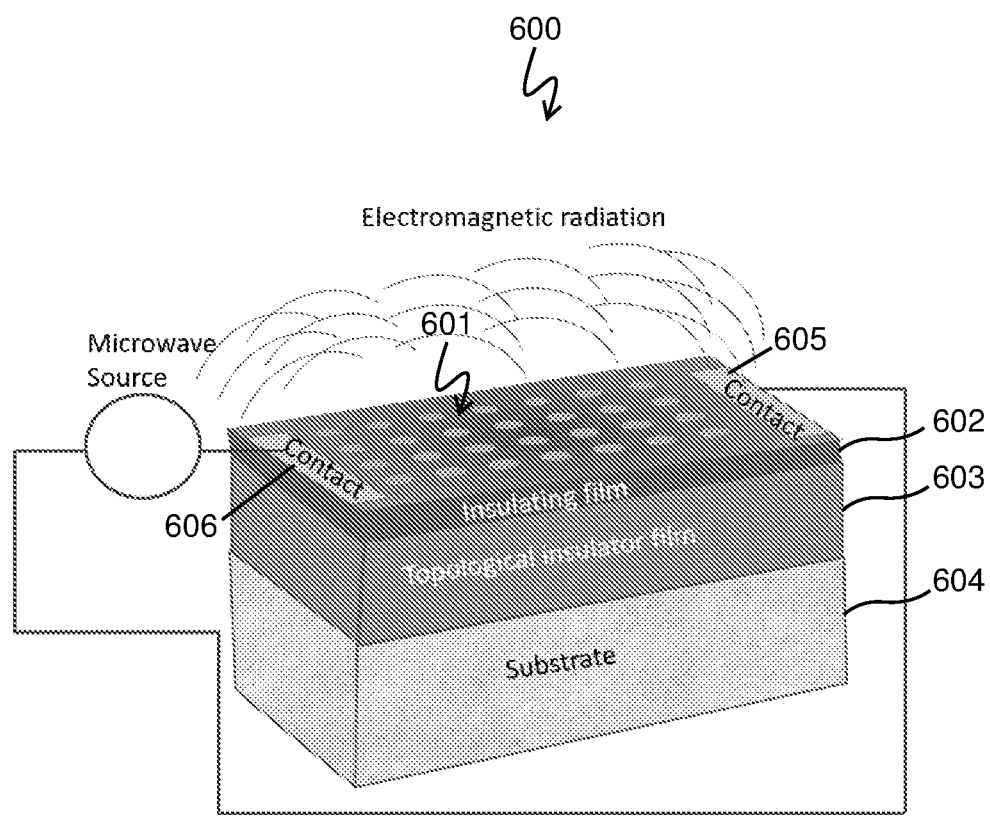
FIG. 6 is an extreme subwavelength electromagnetic antenna comprising a topological insulator film.

FIG. 6 shows as yet a further embodiment an extreme sub-wavelength electromagnetic antenna 600. The antenna comprises an array 601 of nanomagnets arranged on an insulating film 602 over a topological insulator film 603 deposited on a substrate 604. An alternating current is passed through the topological insulator film via contacts 605 and 606. The contacts may be placed directly on top of the topological insulator film. The topological insulator film alternately injects spins of opposite polarization into the nanomagnets. This makes their magnetizations oscillate and emit electromagnetic radiation. The spin Hall angle associated with spin injection from a topological insulator is larger than that associated with spin injection from a heavy metal. Hence, a topological insulator may deliver a stronger spin-orbit torque and increase the radiation efficiency as well as the output power. The driver in this embodiment may be a microwave source or any alternating current source that includes a microwave source.

EXAMPLES

Example 1. Demonstration of an Extreme Subwavelength Nanomagnetic Acoustic Antenna Actuated by Spin-Orbit Torque from a Heavy Metal Nanostrip The nanomagnets and Pt strip were fabricated on a 128° Y-cut LiNbO$_3$ substrate. The substrate was spin-coated with bilayer polymethyl methacrylate (PMMA) e-beam resists of different molecular weights to obtain good undercut: PMMA 495 diluted 4 vol % in Anisole, followed by PMMA 950 also diluted 4 vol % in Anisole. The spin coating was carried out at a spin rate of 2500 rpm. The resists were subsequently baked at 110° C. for 5 min. Next, electron-beam lithography was performed using a Hitachi SU-70 scanning electron microscope (at an accelerating voltage of 30 kV and 60 pA beam current) with a Nabity NPGS lithography attachment. Finally, the resists were developed in methyl isobutyl ketone and isopropyl alcohol (1:3) for 270 s followed by a cold IPA rinse. For nanomagnet delineation, a 5 nm thick Ti adhesion layer was first deposited on the patterned substrate using e-beam evaporation at a base pressure of $\approx 2\times 10^{-7}$ Torr, followed by the deposition of Co. Pt was deposited similarly. The lift-off was carried out using Remover PG solution.

Figure 7A:
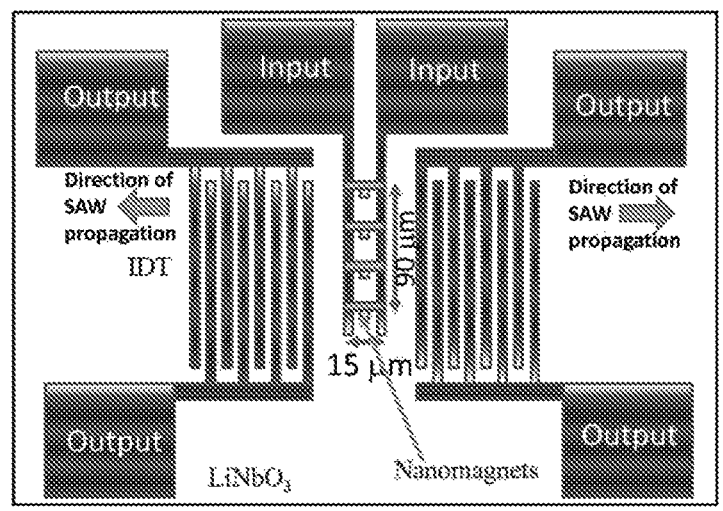
FIG. 7A is a pattern for an acoustic antenna. The figure is not to scale.
Figure 7B:
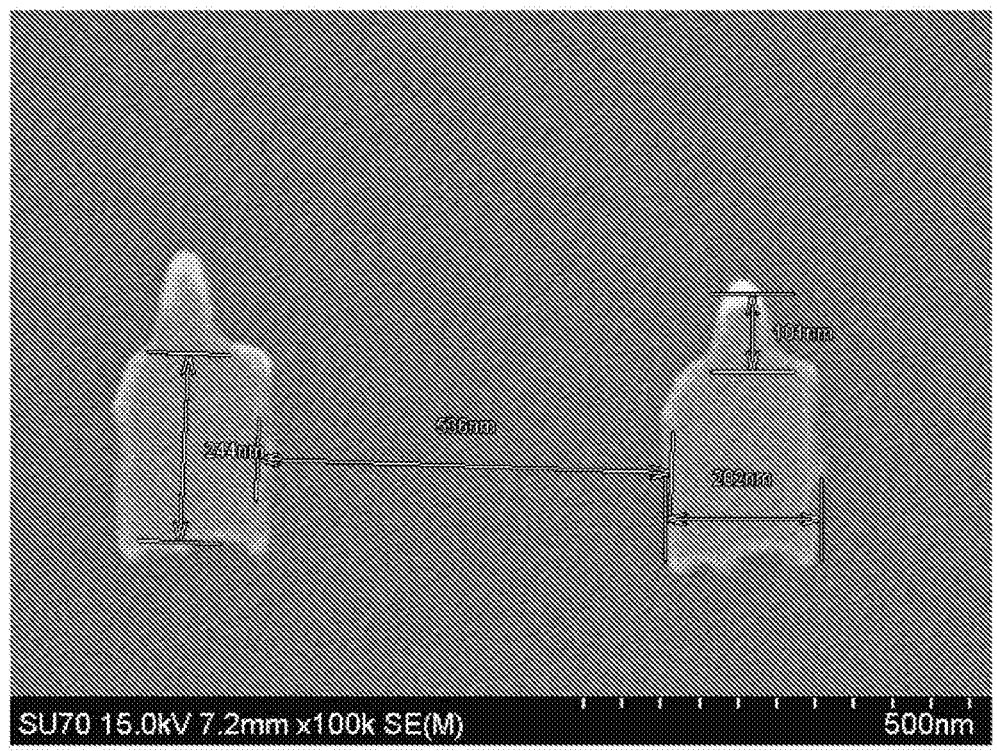
FIG. 7B is a scanning electron micrograph of fabricated Co nanomagnets with Gaussian shaped ledges.

FIG. 7A shows the pattern of the acoustic antenna (with the nanomagnets, Pt lines, contact pads to the Pt lines, and IDTs). FIG. 7B shows a scanning electron micrograph of the fabricated nanomagnets. The nanomagnets are rectangular with long dimension≈250 nm, short dimension≈200 nm, and the ledge length is ≈100 nm. The ledge has a tapered shape and the full width at half maximum is ≈70 nm.

Figure 8A:
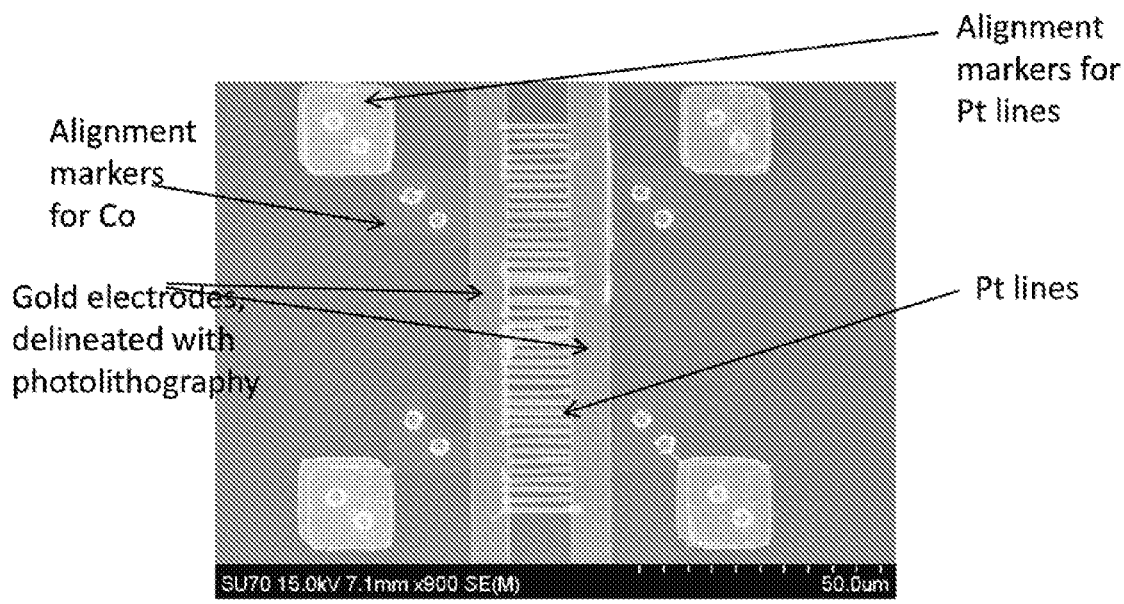
FIG. 8A is a scanning electron micrograph of the platinum lines overlying the nanomagnets.
Figure 8B:
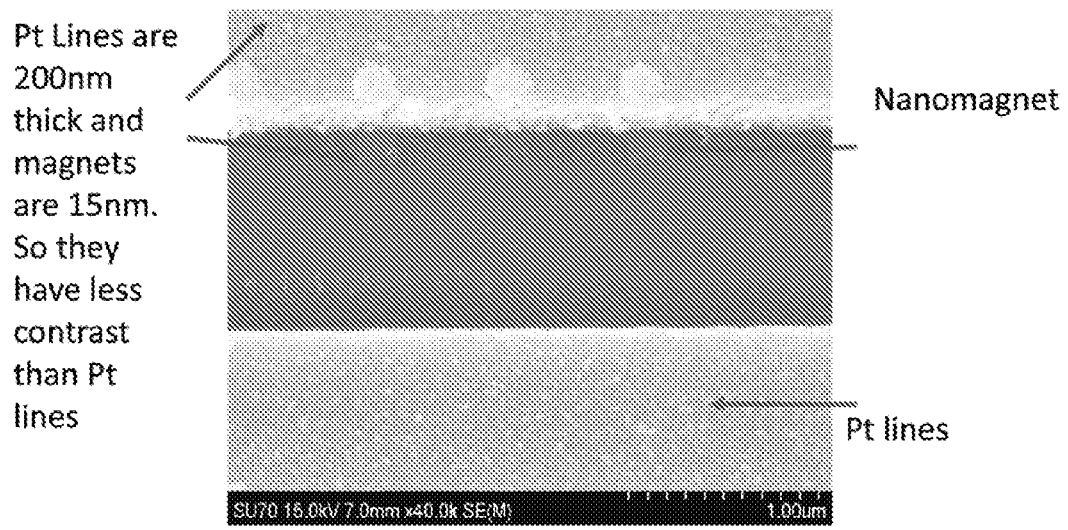
FIG. 8B is a zoomed view of the micrograph from FIG. 8A showing the nanomagnets underneath the platinum line.

FIGS. 8A and 8B show scanning electron micrographs of the Pt line and nanomagnet assembly. There are 40 Pt lines and hence 40 rows of nanomagnets that are contacted.

Figure 9A:
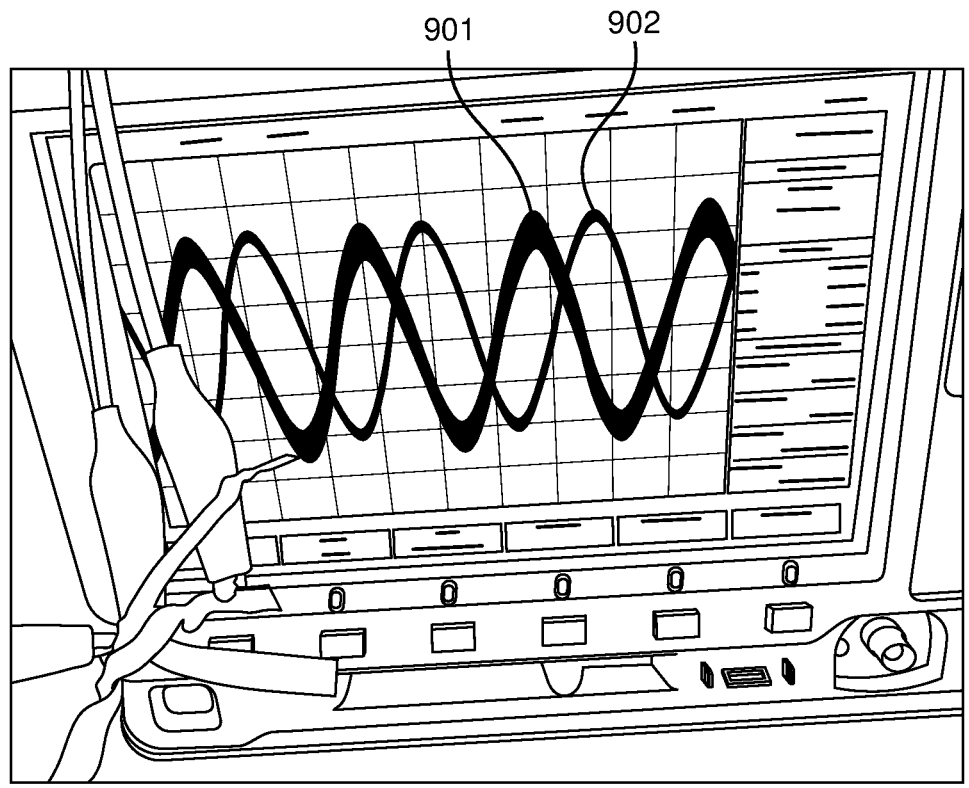
FIG. 9A is oscilloscope traces of the alternating voltage applied across the Pt lines to actuate the acoustic antenna (trace 902) and the alternating voltage detected at the interdigitated transducer (trace 901). They are respectively the input and output signals. The input voltage frequency is 3.63 MHz which is the resonant frequency of the interdigitated transducers (IDT) determined by the spacing of the IDT fingers and the velocity of surface acoustic wave in the substrate. Input voltage peak to peak amplitude is 22.5 V and the detected voltage peak-to-peak amplitude is 0.9 V.
Figure 9B:
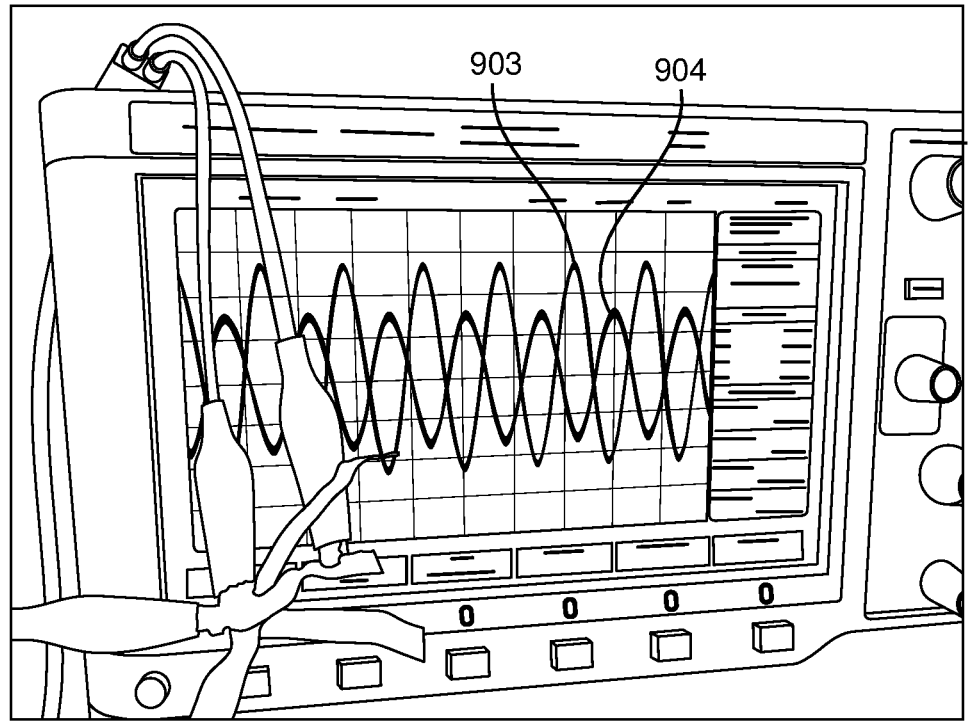
FIG. 9B is oscilloscope traces of the alternating voltage applied across the Pt lines to actuate the acoustic antenna (trace 903) and the alternating voltage detected at the interdigitated transducer (trace 904). They are respectively the input and output signals. The input voltage frequency is 6.87 MHz and the peak-to-peak amplitude is 25.7 V, while the detected voltage peak-to-peak amplitude is 1.65 V.

FIGS. 9A and 9B show both the oscilloscope traces of the sinusoidal voltage applied across the Pt lines to actuate the acoustic antenna via spin-orbit torque and the voltage detected at the IDT. These traces are shown for two frequencies, 3.63 MHz which is the resonant frequency of the IDT, and 6.87 MHz.

The resistance of the 40 parallel Pt lines varied between 98 and 108 ohms from sample to sample. Therefore, the resistance of each Pt nanostrip or line is on the order of 4 kΩ For the case in FIG. 9A, the input voltage of 11.25 V peak-to-zero (measured from the oscilloscope trace) will produce a current of 2.8 mA peak-to-zero in a Pt line. The line has a length of 15 µm, width 1 µm, and thickness 200 nm. Therefore, the peak current density in each Pt line is $1.4\times 10^{10}$ A m$^{-2}$, which should be well above the critical current density needed to produce sufficient spin-orbit torque. In the case of FIG. 9B, the input voltage of 12.85 V peak-to-zero produced a peak-to-zero current of 3.21 mA in a Pt line, resulting in a peak-to-zero current density of $1.6\times 10^{10}$ A$^{m-2}$ in each line.

The input power to the acoustic antenna is calculated as $V_{in}^2/2R_{Pt}$ where $V_{in}$ is the peak-to-zero input voltage and $R_{Pt}$ is the resistance of the 40 Pt lines in parallel. For the case in FIG. 9A, this quantity is 633 mW, while for the case in FIG. 9B, it is 825 mW.

In order to calculate the radiation efficiency, first the power in the acoustic wave that has been produced is determined. The power carried by an acoustic wave of amplitude φ is given by $$P = \frac{1}{2}\gamma_0 \frac{W}{\lambda} \varphi^2 \qquad (1)$$

where $\gamma_0$ is the characteristic admittance of the SAW line and has a value of $2.1\times 10^{-4}$ S for LiNbO$_3$, W is the width of the IDT and λ is the wavelength of the SAW. The IDTs were designed and fabricated for W/λ=40.

Neglecting capacitive and inductive effects, the voltage $V_{out}$ detected at the IDT is related to the SAW amplitude φ as $$\varphi \approx \mu V_{out} \qquad (2)$$

where µ is the response function of an IDT operating in the transmitting mode. For the present system, this quantity was calculated as ≈2 (see V. Sampath, N. D'Souza, D. Bhattacharya, G. M. Atkinson, S. Bandyopadhyay, J. Atulasimha, *Nano Lett.* 2016, 16, 5681.) Hence, for the case shown in FIG. 9A (where $V_{out}$=0.45 V peak-to-zero as seen in the oscilloscope trace) φ=0.9 V peak-to-zero and for the case shown in FIG. 9B, φ=1.6 V peak-to-zero. Therefore, from Equation (2), the SAW power produced in the two cases are 3.4 and 10.7 mW, respectively. The corresponding efficiencies of SAW production are 0.54% and 1.3%, respectively. These numbers are approximate because of some simplifying assumptions such as neglecting inductive and capacitive effects. It is also assumed that the IDT detection efficiency is 100%, which is an overestimate, especially at frequencies that are not the IDT resonant frequency. Hence, the estimates of the antenna efficiencies presented here are conservative.

In the LiNbO$_3$ substrate, the acoustic wave velocity is ≈3300 m s$^{-1}$. Therefore, for a frequency of 3.63 MHz, the acoustic wavelength is ≈1 mm. The nanomagnet assembly acting as the antenna has a dimension of ≈15 µm in the direction of SAW propagation. Hence the ratio of acoustic wavelength to antenna dimension is ≈67, making it an extreme subwavelength antenna (an antenna whose linear dimension is smaller than one-tenth of the wavelength). If the antenna was excited by an acoustic wave and driven at the acoustic resonance, the radiation efficiency would have been limited to ≈(1/67)$^2$=0.02%. The measured efficiency here is about 50 times larger. The present embodiment was able to overcome the limit because the antenna was actuated via spin-orbit torque as opposed to being driven with an acoustic wave.

It was considered whether the output voltage detected at the IDT (shown in FIGS. 9A/9B) could have been due to direct electromagnetic pick up through the air from the input, instead of being from an acoustic wave in the substrate. Electromagnetic pickup, however, could never have produced the phase shifts (time delay) seen between the input and output signals in FIGS. 9A/9B. The measured average distance between the input and output ports is ≈6 mm and the time Δt that it would take an electromagnetic wave to traverse this distance is 20 ps. At a frequency f of 3.63 MHz (FIG. 9A), this would produce a phase lag of $2\pi f \Delta t = 4.56 \times 10^{-4}$ radians between the output and input, which is much smaller than what is observed. For an acoustic wave traveling in the substrate, with a velocity 5 orders of magnitude smaller than that of an electromagnetic wave propagating through the air, $\Delta t$ will be five orders of magnitude larger and the phase shift at this frequency will be 45.6 radians=(14π+1.62) radians. When the modulo $2\pi$ value of this phase shift is taken, this is 1.62 radians. The observed phase shift is about 2.2 radians which is much closer to the acoustic phase shift than the electromagnetic phase shift. This gives confidence that the detected signal is not due to electromagnetic pick up.

Repeating this exercise for the 6.87 MHz frequency will yield an electromagnetic phase shift of $8.63 \times 10^{-4}$ radians and an acoustic phase shift of 86.3 radians=(26π+4.6) radians. The modulo $2\pi$ value of this phase shift is 4.6 radians which is close to the observed value of 3.3 radians. This again gives confidence that the observed output voltage at the IDT is indeed due to the generated surface acoustic wave.

In conclusion, this Example demonstrates an acoustic antenna actuated by the spin-orbit torque from a heavy metal nanostrip. The use of this novel actuation mechanism allows for an extreme subwavelength acoustic antenna with a radiation efficiency over 50 times larger than the limit for an acoustic antenna actuated by an acoustic wave and operated at acoustic resonance.

Example 2. Extreme Sub-Wavelength Magneto-Elastic Electromagnetic Antenna Implemented with Multiferroic Nanomagnets This Example demonstrates an extreme sub-wavelength EM antenna whose radiation efficiency exceeds the $A/\lambda_{EM}^2$ limit by a factor exceeding $10^5$.

An extreme-sub-wavelength EM antenna was constructed as an array of magnetostrictive (Co) nanomagnets of dimension ~300 nm fabricated on a piezoelectric 128° Y-cut LiNbO$_3$ substrate. The substrate was spin-coated with bilayer polymethyl methacrylate (PMMA) e-beam resists of different molecular weights to obtain good undercut: PMMA 495 diluted 4% by volume in Anisole, followed by PMMA 950 also diluted 4% by volume in Anisole. The spin coating was carried out at a spinning rate of 2500 rpm. The resists were subsequently baked at 110° C. for 5 min. Next, electron-beam lithography was performed using a Hitachi SU-70 scanning electron microscope (at an accelerating voltage of 30 kV and 60 pA beam current) with a Nabity NPGS lithography attachment. Finally, the resists were developed in methyl isobutyl ketone and isopropyl alcohol or MIBK-IPA (1:3) for 270 s followed by a cold IPA rinse.

For nanomagnet delineation, a 5-nm-thick Ti adhesion layer was first deposited on the patterned substrate using e-beam evaporation at a base pressure of $\sim 2 \times 10^{-7}$ Torr, followed by the deposition of Co. The lift-off was carried out using Remover PG solution.

A surface acoustic wave (SAW) was launched in the substrate with electrodes and the SAW periodically strained the nanomagnets, causing their magnetizations to rotate owing to the inverse magnetostriction (Villari) effect. The rotating magnetizations emit EM waves (at the frequency of the SAW), which were detected in the far field by a dipole antenna coupled to a spectrum analyzer. The SAW (excitation) frequency was 144 MHz. The inventors were able to detect EM emissions at the same frequency that was 8 dBm above ambient emissions, at a distance>2 m from the antenna. A control sample (that contained no nanomagnets, but was otherwise identical to the actual sample) was used for background subtraction. The inventors were thus able to measure the EM emission from the nanomagnets at the exclusion of all other emitters (e.g. surface currents in the electrodes that are used to launch the SAW and any other spurious source radiating at or near 144 MHz).

Figure 10A:
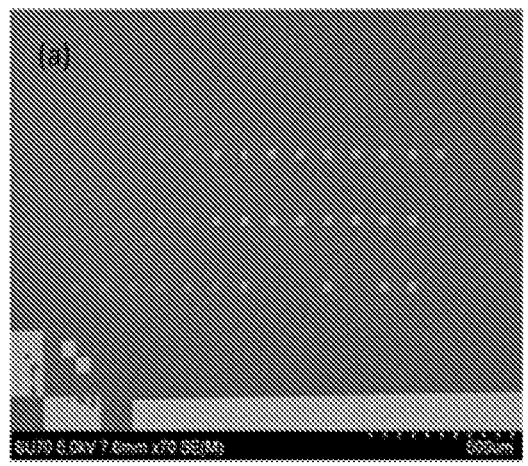
FIG. 10A is a scanning electron micrograph of nanomagnet arrays in Sample A.
Figure 10B:
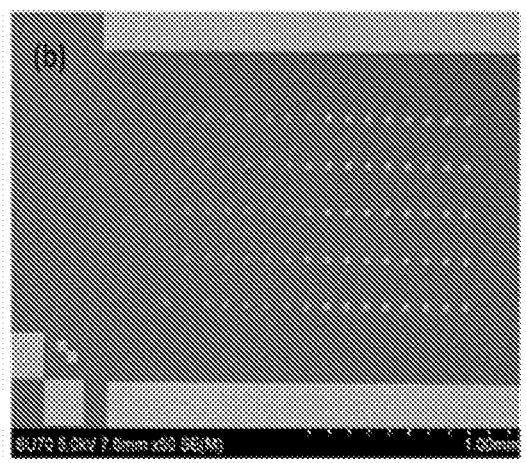
FIG. 10B is a scanning electron micrograph of nanomagnet arrays in Sample B.
Figure 10C:
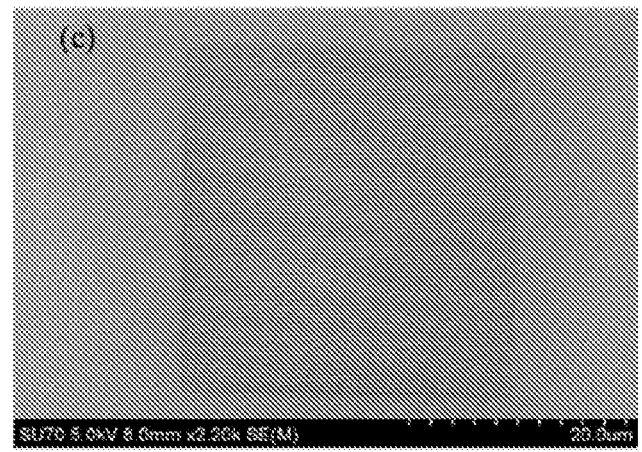
FIG. 10C is a magnified image of one array in Sample B. The magnification is not enough to resolves individual nanomagnets.
Figure 11A:
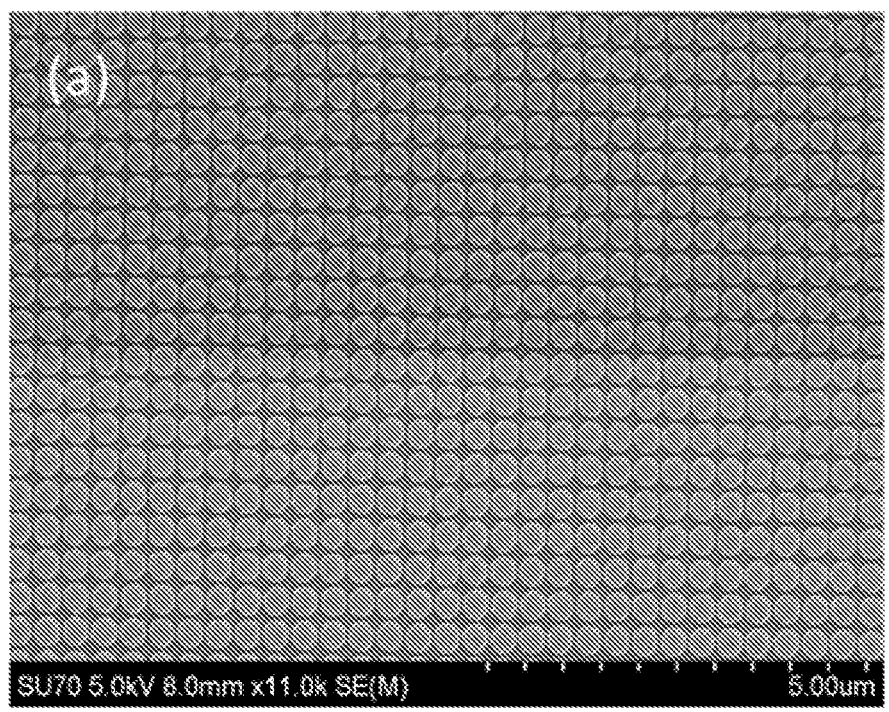
FIG. 11A is a scanning electron micrograph of an array in Sample B.
Figure 11B:
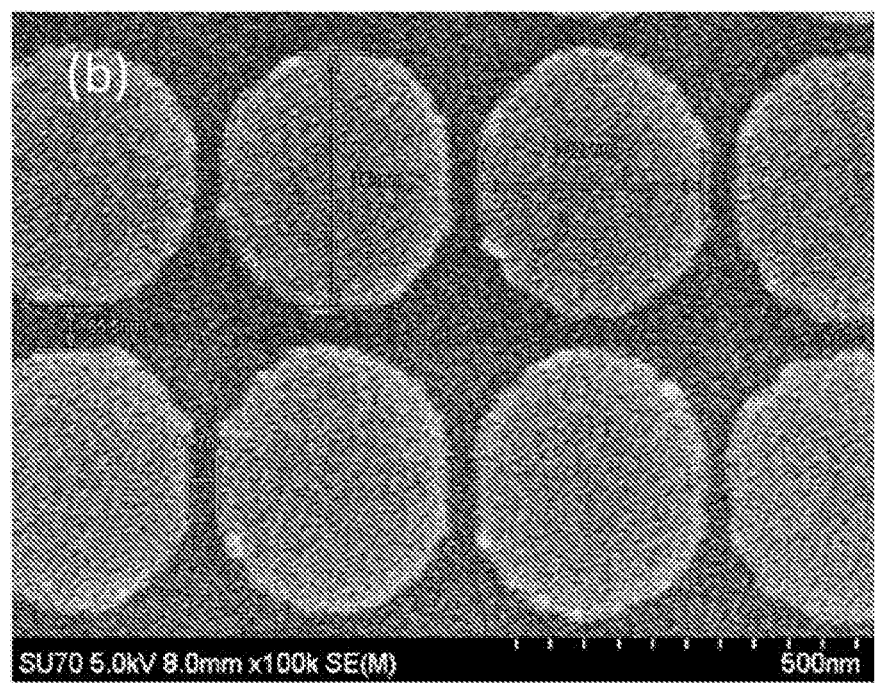
FIG. 11B is a scanning electron micrograph of the same array as in FIG. 11A but at a higher magnification showing the nanomagnets are slightly elliptical with major axis dimension of ~360 nm, minor axis dimension of 330 nm, vertical edge-to-edge separation of ~65 nm and horizontal edge-to-edge separation of ~42 nm.

FIGS. 10A, 10B, and 10C show the scanning electron micrographs of the nanomagnet arrays that were fabricated. Two sets of samples were made: Sample A and Sample B. The former contained 55,000 nanomagnets and the latter 275,000 nanomagnets. FIGS. 10A and 10B show low magnification images of several rectangular arrays in the two samples (each white speck is an array). FIG. 10C shows a zoomed image of one such array (where the magnification is not enough to resolve individual nanomagnets). FIGS. 11A and 11B show the nanomagnets at higher magnifications that allow one to resolve individual nanomagnets.

Figure 12:
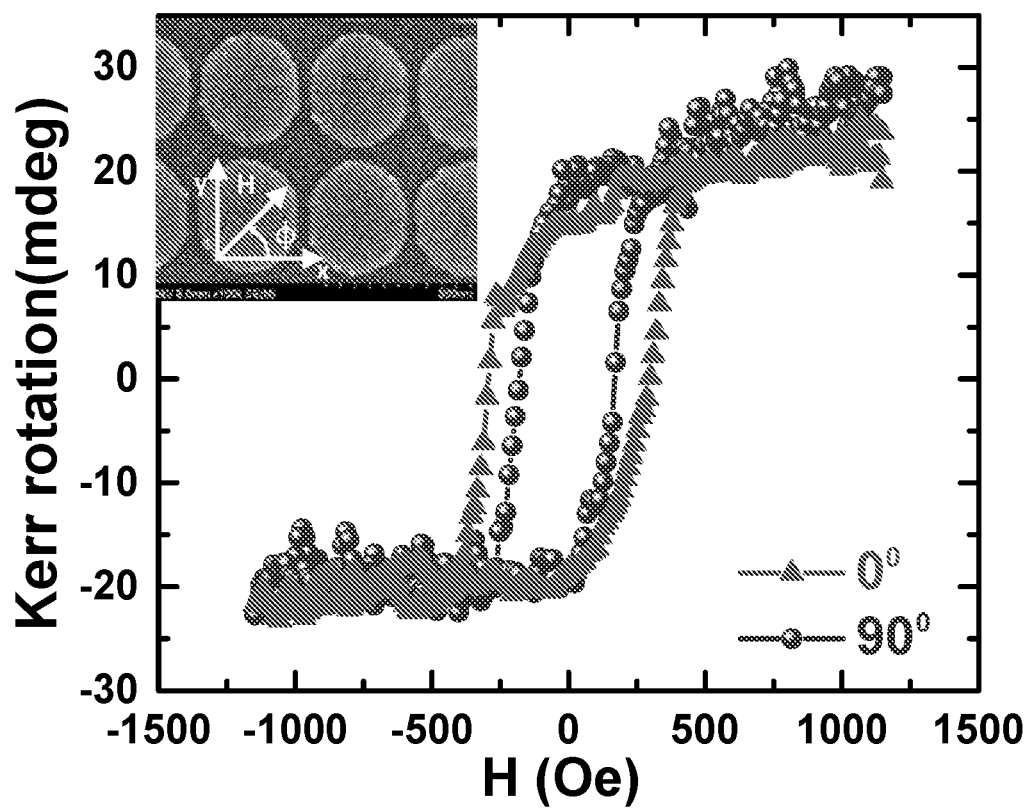
FIG. 12 shows Kerr rotation versus magnetic field of the array in Sample B. The Kerr rotation angle is proportional to the magnetic moment. There is ~100 Oe difference between the coercivities when the magnetic field orientation is rotated by 90°.

The magnetic behavior of the nanomagnets was characterized with static magneto-optical Kerr effect (S-MOKE) at room temperature. FIG. 12 shows the Kerr rotation versus magnetic field characteristics (hysteresis loops) under two situations: when the magnetic field is directed along the horizontal axis of the arrays and when directed along the vertical axis. The hysteresis loops confirm that the fabricated nanostructures are ferromagnetic at room temperature. The coercivity is 100 Oe higher when the magnetic field is directed along the horizontal axis which is parallel to the minor axes of the elliptical nanomagnets because this is the hard axis while the major axis is the easy axis.

In order to demonstrate the antenna function and also measure the antenna characteristics, SAW signal was launched in the substrate at two different frequencies (fSAW=144 MHz and 900 MHz). Any detectable EM emission (above the noise floor determined by ambient emissions) was measured at a distance>2 m from the samples. The detector was a dipole antenna calibrated to specific frequencies and these two frequencies belonged to that set, which is why they were chosen.

EM emissions were detected at 144 MHz, but not at 900 MHz which was too high a frequency for the magnetization of the nanomagnets to rotate. At 144 MHz, the EM wavelength is 2 m. Since the separation between the detector and the antenna was greater than the EM wavelength, we were measuring the far-field emission.

The SAW velocity in the LiNbO$_3$ substrate is about 4100 m/sec, and hence the SAW wavelength is 28.4 μm at 144 MHz, while the EM wavelength is 2 m at that frequency. The ratio of the SAW to EM wavelength is thus $1.42 \times 10^{-5}$.

Figure 13:
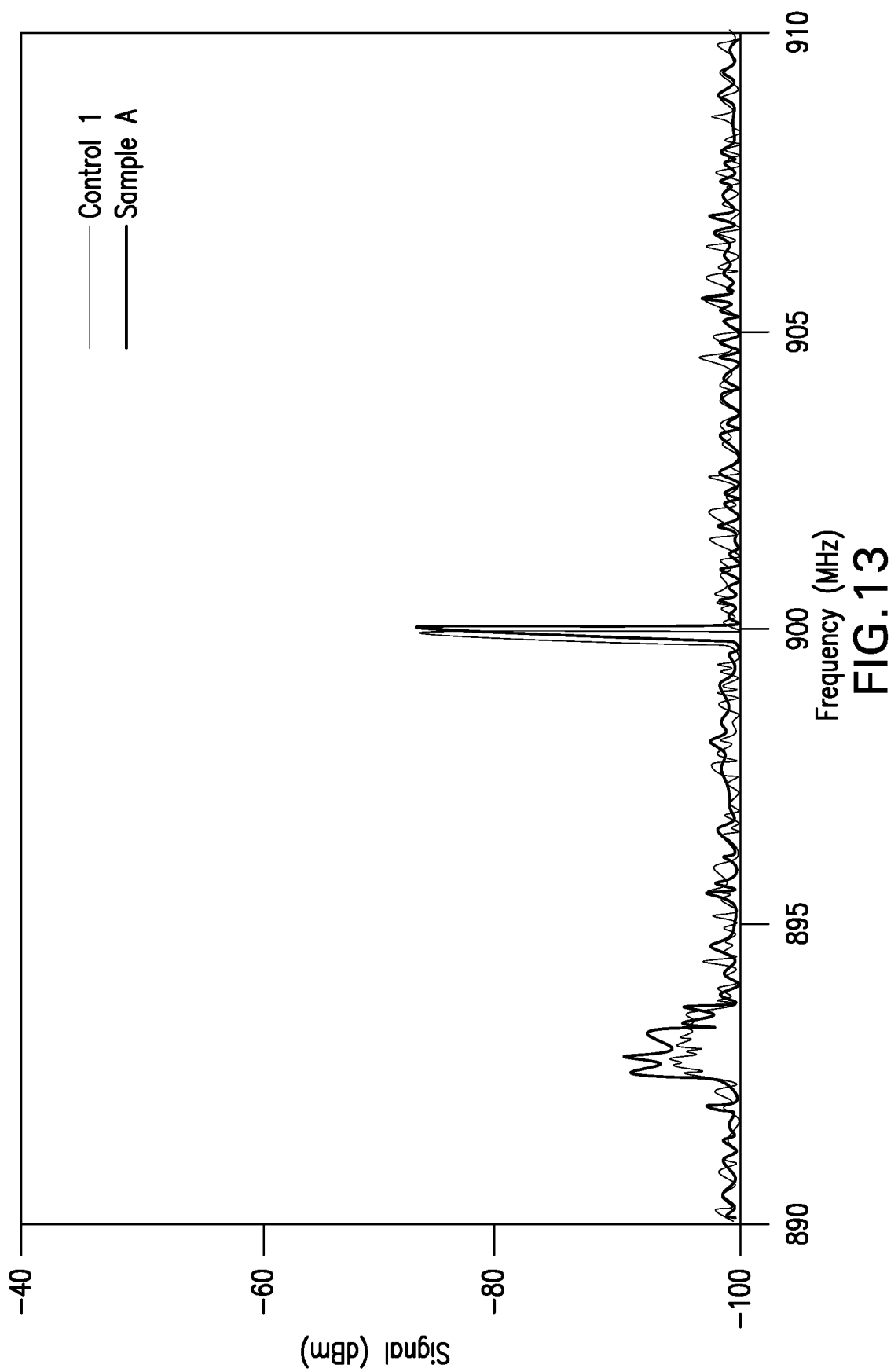
FIG. 13 is the power spectra of emissions detected by a dipole antenna coupled to a spectrum analyzer when the SAW frequency is 900 MHz. The antenna is placed >2 m from the sample. The spectra are shown for Sample A and the control sample. There is only ~1 dB difference between the two samples showing that the nanomagnets are not radiating sufficiently at this frequency. The input power to launch the SAW was 5 dbm (3.16 mW).

Measurements were made for both samples A and B containing nanomagnets, as well as control samples that were otherwise identical to the real samples but had no nanomagnets. FIG. 13 shows the detection results at fSAW=900 MHz for Sample A (screenshots of the spectrum analyzer are shown in the Supplementary Material). There is ~1 dB difference between the 900 MHz emissions from the real sample (with nanomagnets) and the control sample (without nanomagnets), indicating that the nanomagnets are radiating very weakly at 900 MHz, if at all. Most likely, the nanomagnets do not radiate sufficiently because they are not able to rotate their magnetizations through sufficiently large angles at this high rate (900 MHz). Surface currents induced in the electrodes used to launch the SAW in both samples also radiate electromagnetic waves at 900 MHz and the detected emissions are primarily due to that. Similar (negative) result was obtained with Sample B.

Past simulations by the inventors have shown that strain induced large angle magnetization rotation in single domain elliptical nanomagnets (of lateral dimension ~100 nm) typically takes place in about 1 ns. The nanomagnets used here were larger (>300 nm lateral dimension) and multidomain. Hence, it is possible that they rotate slower and therefore, the period of the 900 MHz signal (1.1 ns) does not allow them enough time to rotate through a large angle and radiate electromagnetic waves. Subsequently, the excitation frequency was reduced to 144 MHz. The detection results are shown in FIG. 14.

Figure 14:
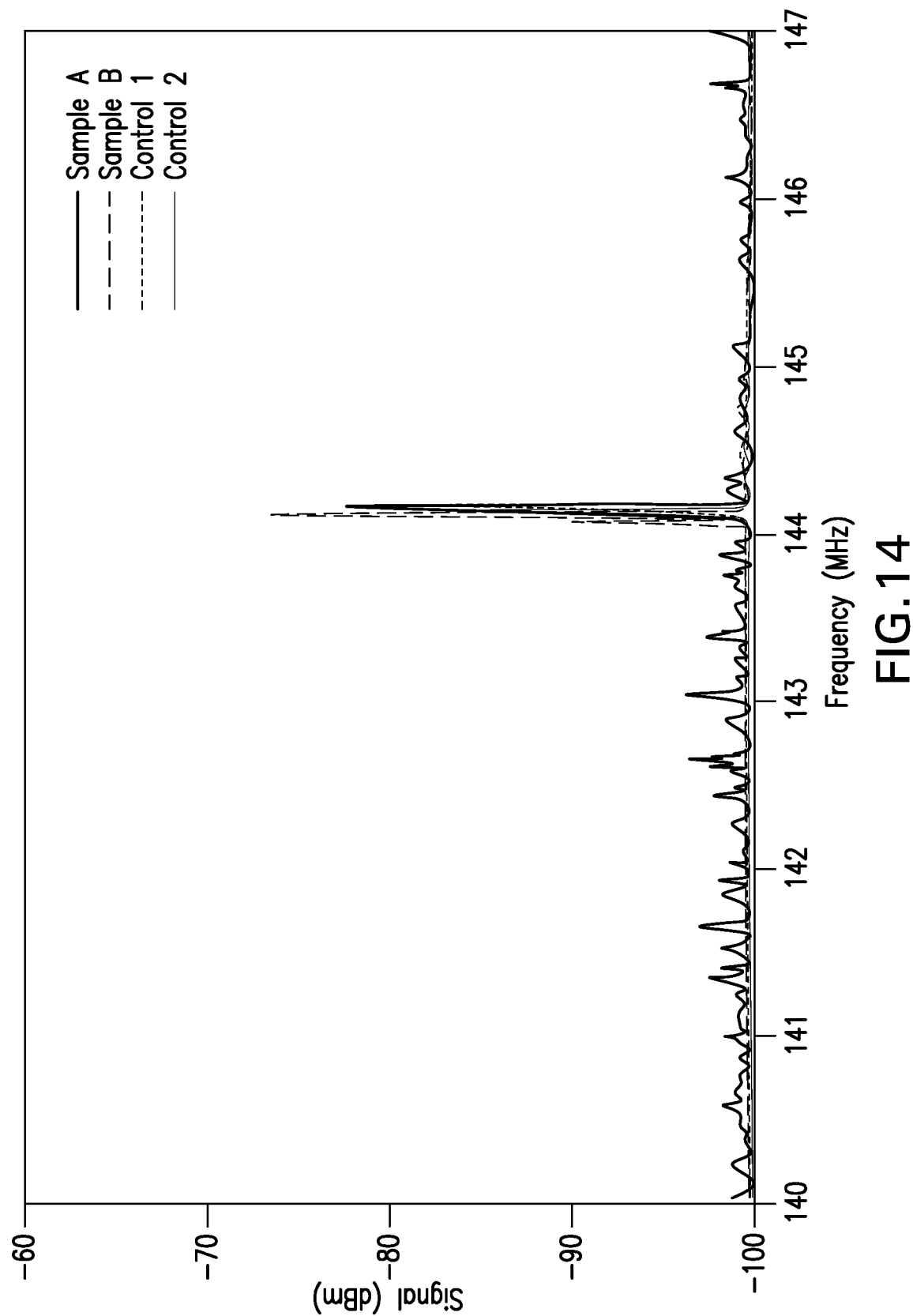
FIG. 14 is the power spectra of emissions detected when the SAW frequency is 144 MHz. Control 1 is the control sample corresponding to Sample A, and Control 2 is the one corresponding to Sample B. The input power was 5 dbm (3.16 mW). The detected emission from Sample B is 8 dB above that of Control 2 and is −73 dbm (50 pW).

FIG. 14 clearly shows a measurable difference between the real samples and the control samples. The detected radiation power from Sample B is 8 dB higher than that from the control sample, while that from Sample A is 3 dB higher than that from the control sample. These differences indicate that the nanomagnets are able to rotate their magnetizations at this lower frequency and emit EM waves.

Figure 15A:
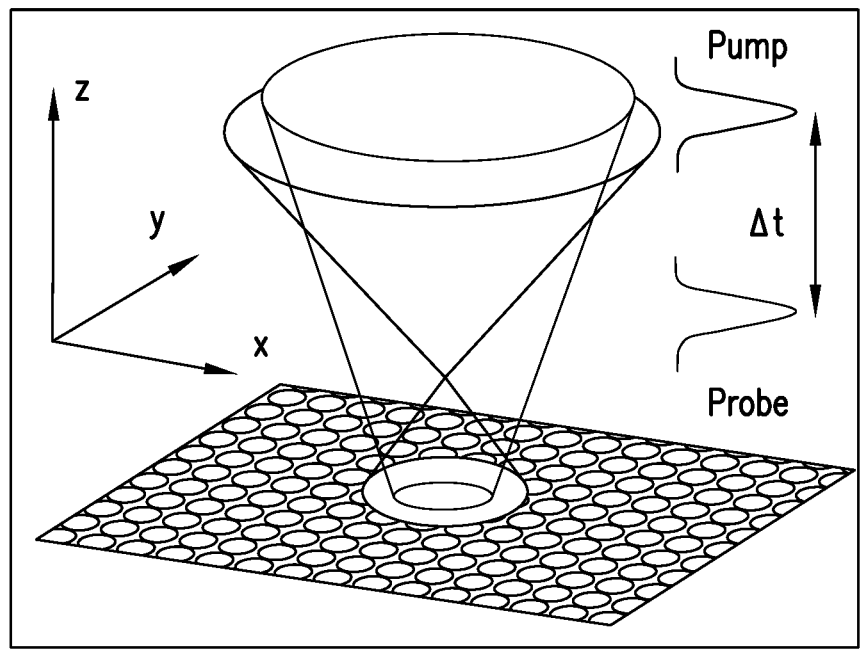
FIG. 15A is a schematic of the TR-MOKE microscope showing the pump and probe beams and the geometry of the measurement. The probe beam spot covers about 4 nanomagnets.

Time-resolved magneto-optical Kerr effect (TR-MOKE) measurements were also carried out on the nanomagnets at room temperature at various amplitudes of SAW excitation to verify that the launched SAW indeed has an effect on the magnetization rotation. The oscillations in time-resolved Kerr rotations were measured with a micro-focused optical pump-probe set up as shown in FIG. 15A. Details of the set-up (e.g. beam spot size, pulse width, repetition rate, etc.) can be found elsewhere and hence not repeated here. See, for example, S. Mondal, M. A. Abeed, K. Dutta, A. De, S. Sahoo, A. Barman and S. Bandyopadhyay, Hybrid magnetodynamical modes in a single magnetostrictive nanomagnet on a piezoelectric substrate arising from magnetoelastic modulation of precessional dynamics, *ACS Appl. Mater. Interfaces*, 10, 43970-43977 (2018). See also A. Barman and J. Sinha in *Spin Dynamics and Damping in Ferromagnetic Thin Films and Nanostructures*, Springer International Publishing AG, (2018).

Figure 15B:
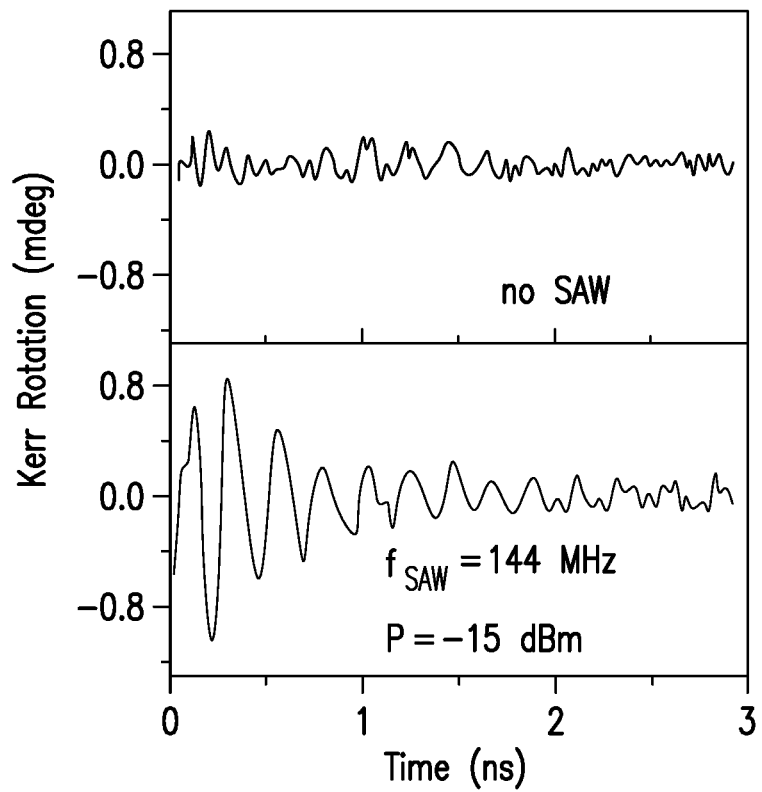
FIG. 15B is the oscillations in time-resolved Kerr rotation in the absence of any externally launched SAW (top panel) and in the presence of an externally launched SAW at 144 MHz frequency with a power of −15 dBm (31.6 µW). The ultrashort laser pulses however independently induce high frequency SAW waves in the substrate, which cause high frequency oscillation of the magnetizations, leading to some Kerr oscillations. The oscillations are much more pronounced and have much larger amplitudes (before damping sets in) in the presence of the SAW.
Figure 15C:
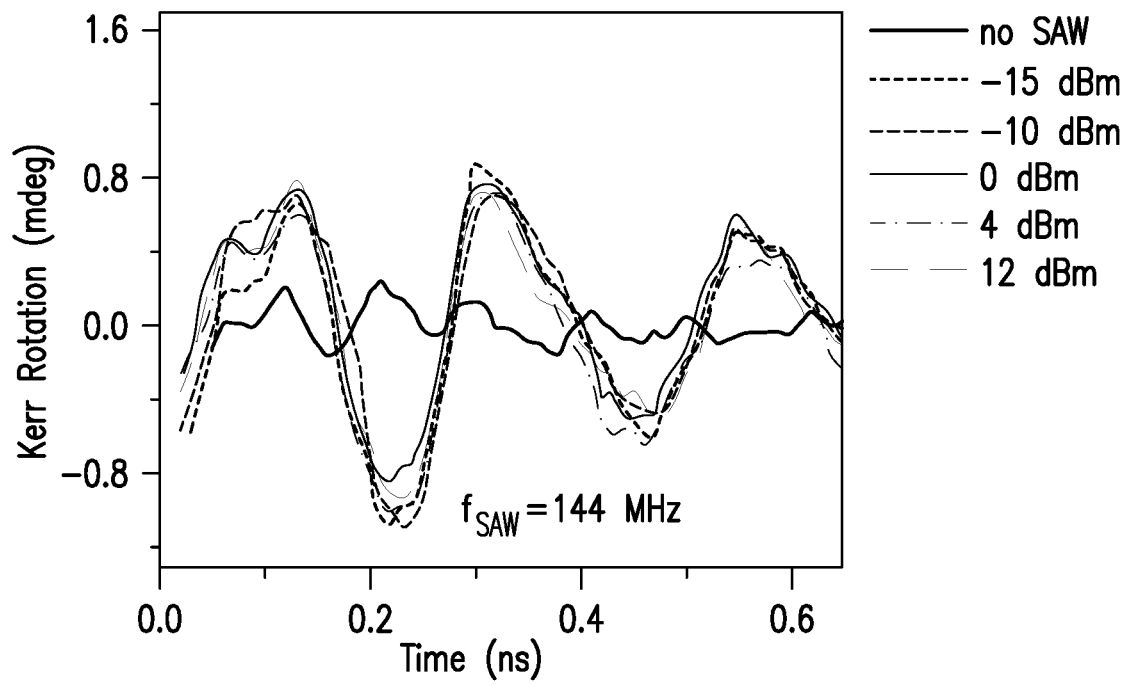
FIG. 15C is the oscillations in time-resolved Kerr rotations at various SAW power levels. The SAW frequency is 144 MHz, which is the frequency used in the antenna experiment.

The measurements were done in the absence of any bias magnetic field. The ultrashort laser pulses used in the TR-MOKE measurements set up very high frequency (~4 GHz) oscillations of the nanomagnets' magnetizations and surprisingly, it was found that the amplitudes of the Kerr oscillations resulting from these high frequency oscillations are significantly increased by the launched SAW with fSAW=144 MHz. The amplitudes are markedly different in the absence of SAW versus in the presence of SAW. The amplitudes also show a rather weak dependence on the launched SAW power (P) for P>−15 dBm. These results are shown in FIGS. 15B and 15C.

Figure 15D:
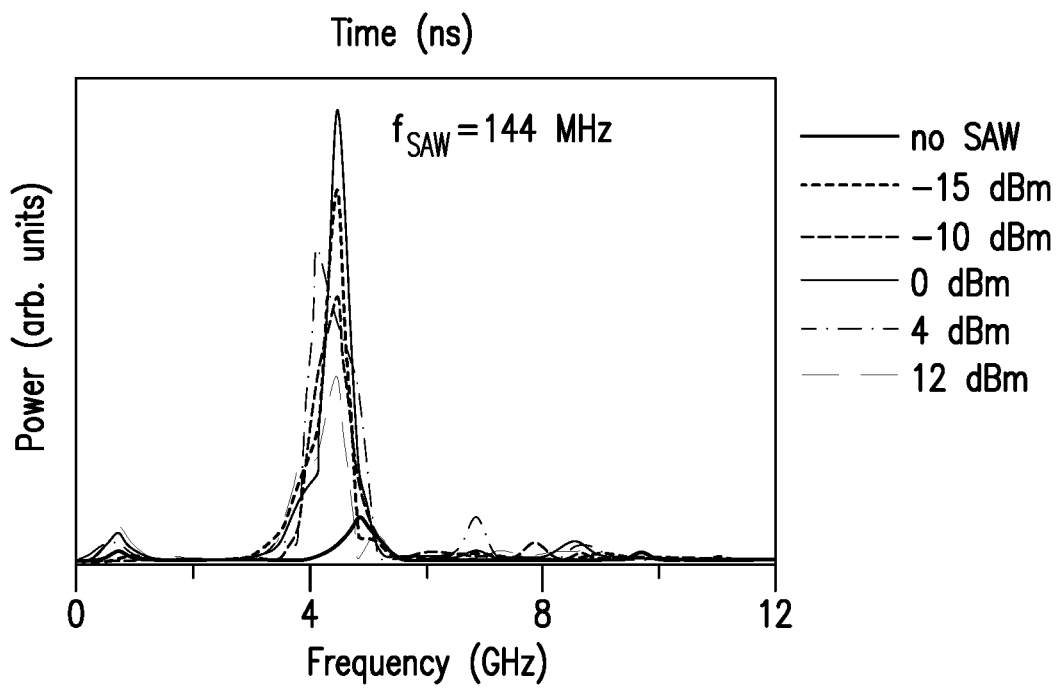
FIG. 15D is power spectral densities of the Kerr oscillations at launched SAW frequency of 144 MHz for various SAW power.

It is noted that the SAW frequency (fSAW=144 MHz) is more than an order of magnitude lower than the Kerr oscillation frequencies which are in the neighborhood of 4 GHz. The Kerr oscillations are not caused by the launched SAW. Instead, they are caused by the ultrashort laser pulses in the TR-MOKE set-up. The excitation by the femtosecond laser causes an ultrafast demagnetization of the nanomagnets followed by two-step relaxation (not shown) which also launches an ultrafast internal field to trigger magnetization precession of the nanomagnets. The absence of any bias magnetic field ensures that the magnetization precesses around an effective magnetic field due to the dipolar coupling fields between the nanomagnets, which leads to a dominant natural resonance frequency at around 4 GHz. Clearly the launched SAW strongly affects the amplitude of this resonant oscillation of magnetization despite being highly off-resonant and having a very weak SAW power. FIG. 15D shows the fast Fourier transforms (power spectral densities) of the Kerr oscillations for various SAW power. The ensuing power spectral densities are also affected by the SAW due to the variation in the magnetization oscillation amplitudes.

Figure 16A:
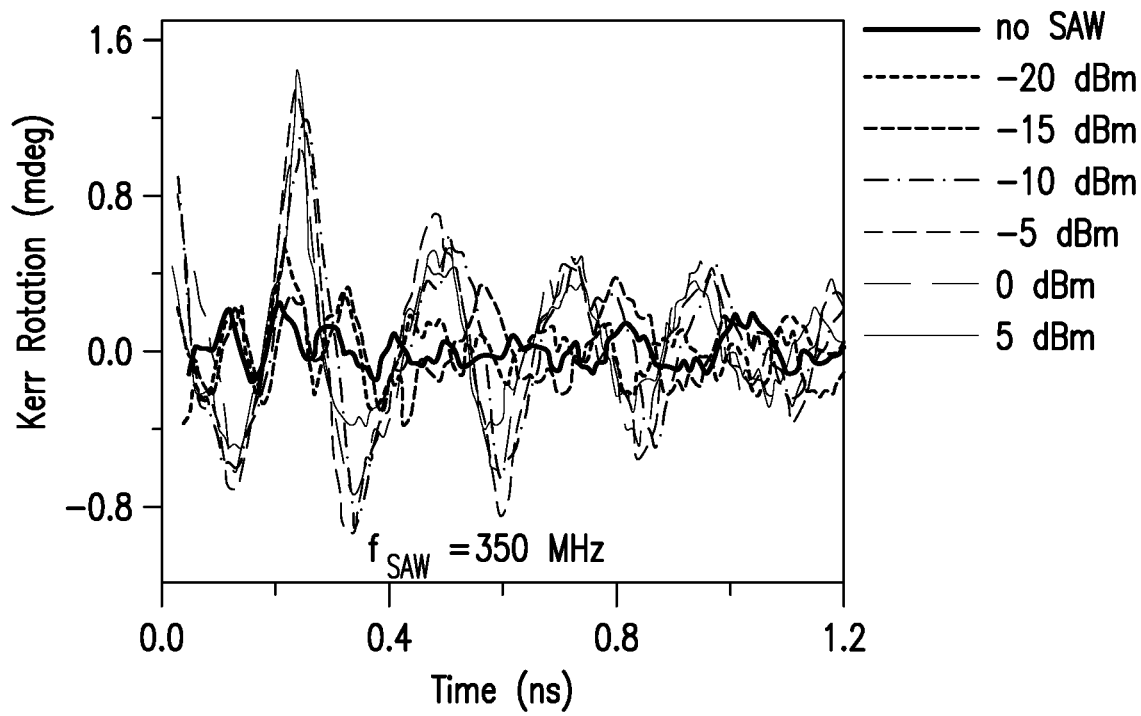
FIG. 16A is the oscillations in time-resolved Kerr rotations at various SAW power when the SAW frequency is 350 MHz.
Figure 16B:
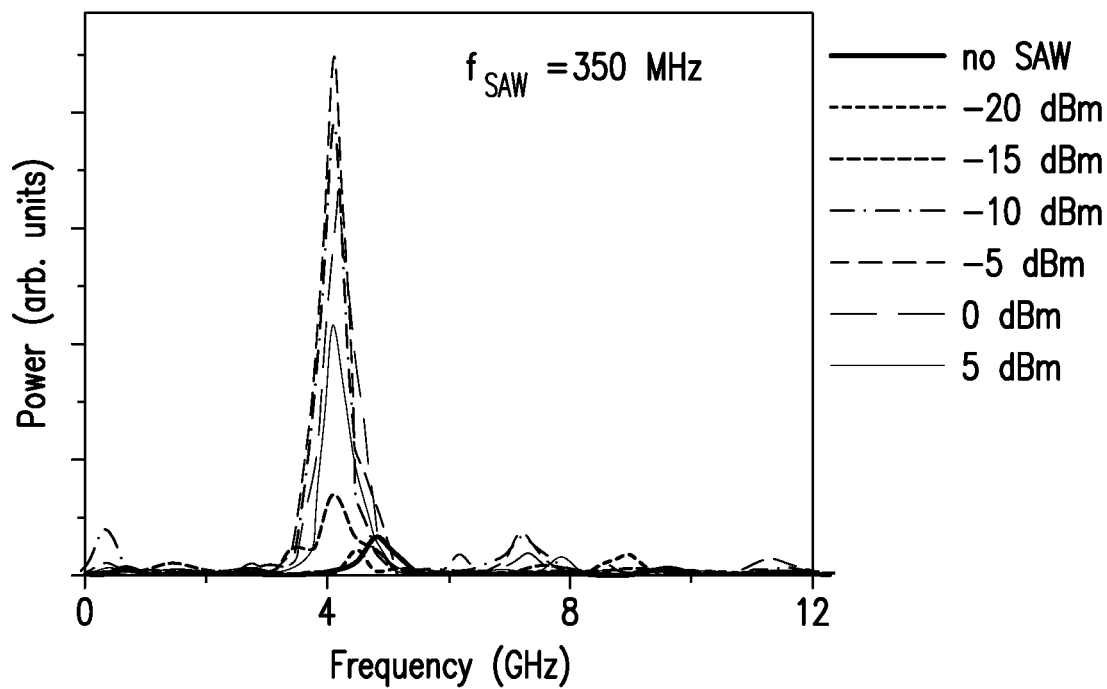
FIG. 16B is power spectral densities of the Kerr oscillations at various SAW powers when the SAW frequency is 350 MHz.

In the TR-MOKE experiments, it was not possible to detect any Kerr oscillation having a frequency component at the launched SAW frequency of 144 MHz because the time delay between the pump and probe laser (Δt) was only up to 3 ns and hence the lowest frequency component that could be resolved was about ⅓ ns, i.e. 333 MHz. Therefore, a SAW was launched of frequency fSAW=350 MHz. The time-resolved Kerr rotations and their fast Fourier transforms are shown in FIGS. 16A and 16B. In FIG. 16B it is still not possible to detect any clear and consistent peak at 350 MHz. This indicates that either the SAW, by itself, cannot induce sufficient magnetization rotation at this high frequency of 350 MHz, or any signature of that rotation is being drowned by the much stronger Kerr oscillations caused not by the SAW, but by the ultrashort laser pulses. However, the clear observation that the SAW power affects Kerr oscillations significantly indicates unambiguously that the SAW affects magnetization oscillations and thus could be the source of the electromagnetic emission which is observed.

Figure 17:
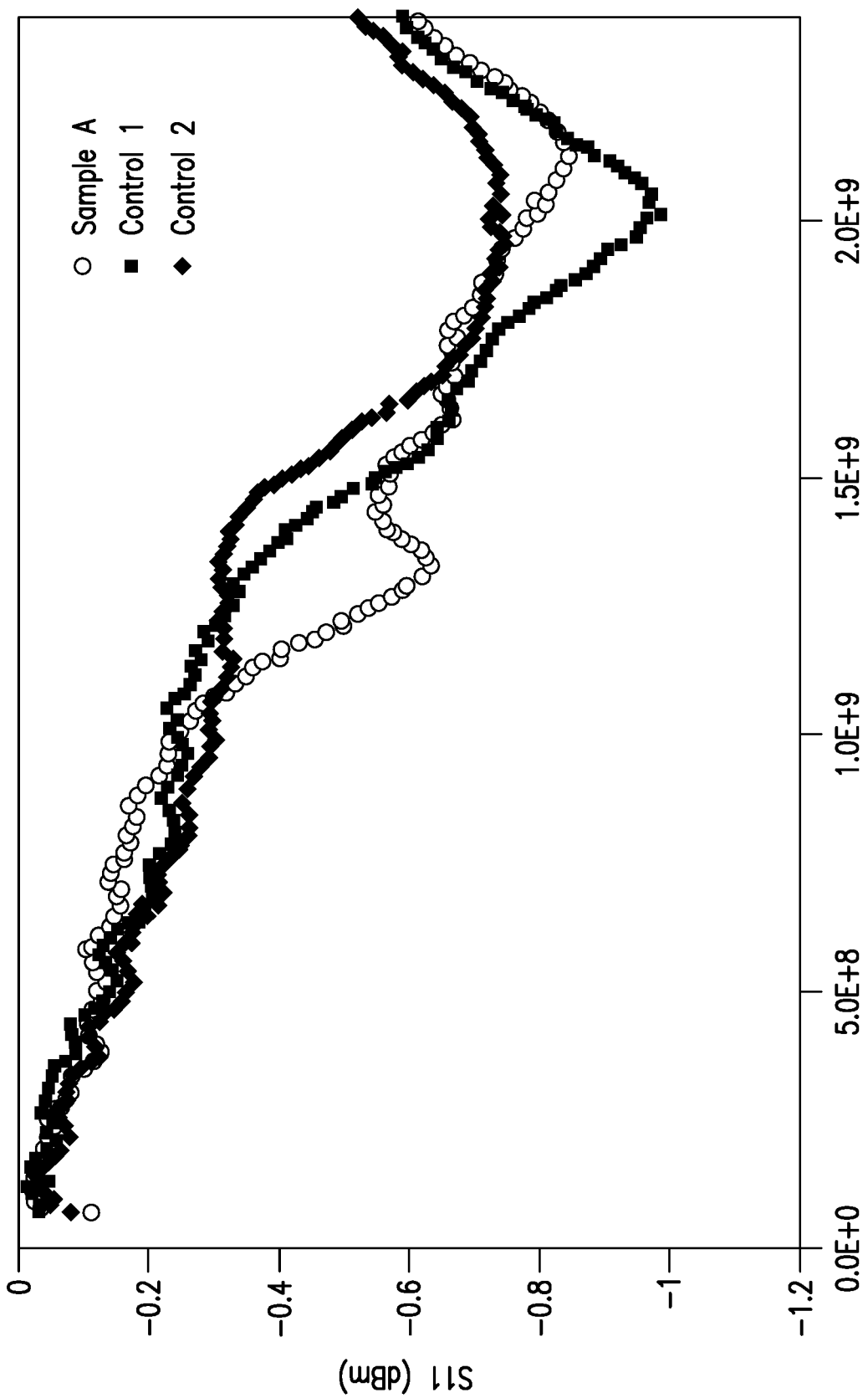
FIG. 17 is reflection coefficient $S_{11}$ as a function of input signal frequency.

In FIG. 17, we show the reflection coefficient $S_{11}$ (measured at the electrodes that launch the SAW) at the input power of 5 dbm (3.16 mW) as a function of frequency. The measurements are carried out with a network analyzer for Sample A, as well as the control samples. At the frequency of 144 MHz, ~85% of the input power is reflected back to the source because of impedance mismatch and hence only about 15% of the input power is coupled into the SAW. Therefore, the actual power fed to the antenna is 3.16× 0.15=0.474 mW. This is the input power to Sample A, and the input power to Sample B is about the same.

The EM power from Sample B that is detected by the receiving dipole antenna is −73 dBm (see FIG. 14) which is about 50 pW. The power radiated by the control sample that is detected by the antenna is −81 dBm, which is 8 pW. Hence the power detected from the nanomagnets is 42 pW. The actual radiated power from Sample B is radiated over 4π solid angle and the fraction that is incident on the receiving dipole antenna is $$\frac{lw}{4\pi r^2}$$

where l is the length of the receiving antenna, w is its width and r is the separation between the source and the detector. In our case l=1 m, w=0.5 cm and r=2 m. Hence the ratio $$\frac{lw}{4\pi r^2}$$

is $10^{-4}$ and consequently, the power actually radiated by Sample B is 42×10⁴ pW=0.42 μW. Consequently, the radiation efficiency, which is the ratio of the radiated power to the input power, is 0.42 μW/0.474 mW=0.088% in the case of Sample B. In the case of Sample A, the detected power was −78 dBm, which is about 15 pW. Therefore, the power radiated by the nanomagnets in sample A was 15 pW−8 pW=7 pW. In this case, the efficiency is 0.07 μW/0.474 mW=0.014%. Since Sample A had 55,000 nanomagnets and Sample B had 275,000 nanomagnets, it is expected that the radiation from Sample A be weaker than the radiation from Sample B.

Now the $A/\lambda_{EM}^2$ limit is calculated for both samples. The area of a nanomagnet is $$\frac{\pi}{4}(a \times b)$$

where a is the major axis dimension (360 nm) and b is the minor axis dimension (330 nm). Since there are 55,000 nanomagnets in Sample A, the radiating area is $$A = \frac{\pi}{4}(360 \times 330) \times 10^{-18} \times 55,000 = 5 \times 10^{-9} m^2.$$

Hence, in the case of Sample A, $A/\lambda_{EM}^2 = 1.25 \times 10^{-9}$, which means that the measured efficiency of 0.014% was able to beat the $A/\lambda_{EM}^2$ limit by 112,000 times. In the case of Sample B, the radiating area is $$A = \frac{\pi}{4}(360 \times 330) \times 10^{-18} \times 275,000 = 2.5 \times 10^{-8} m^2.$$

Hence for Sample B, $A/\lambda_{EM}^2 = 6.25 \times 10^{-9}$, which means that the measured efficiency of 0.088% was able to beat the $A/\lambda_{EM}^2$ limit by 140,800 times in Sample B.

This Example demonstrates extreme sub-wavelength electromagnetic antennas whose radiation efficiencies greatly exceed the theoretical limit of $A/\lambda_{EM}^2$ ($A < \lambda_{EM}$) [where A is the emitting area and $\lambda_{EM}$ is the wavelength of the emitted electromagnetic wave] by a factor exceeding $10^5$. This allows new extents to the miniaturization of electromagnetic antennas. In this Example, the emitting areas of the antennas are about $2 \times 10^8$ times smaller than the square of the emission wavelength. This drastic miniaturization was made possible by exciting the antennas at acoustic resonance instead of electromagnetic resonance. The surface acoustic waves were also found to amplify the magnetization response of these nanomagnets resonating in GHz frequencies, which is yet another application of the technology.

In this disclosure, where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are described.

While exemplary embodiments of the present invention have been disclosed herein, one skilled in the art will recognize that various changes and modifications may be made without departing from the scope of the invention as defined by the following claims.

What is claimed is:

1. A subwavelength electromagnetic antenna, comprising
a piezoelectric substrate;
an array of magnetostrictive nanomagnets in elastic contact with the piezoelectric substrate; and
a driver configured to actuate the array by causing magnetization oscillations in the magnetostrictive nanomagnets using surface acoustic waves (SAWs) launched in the piezoelectric substrate, wherein the driver is configured to change SAW frequencies to cause the array to radiate electromagnetic waves at multiple frequencies that match the SAW frequencies up to a predetermined limit,
wherein the array of magnetostrictive nanomagnets is configured to (i) convert phonons of the SAWs to magnons via phonon-magnon coupling and (ii) convert the magnons to photons of the electromagnetic waves via magnon-photon coupling.

2. The subwavelength electromagnetic antenna of claim 1, wherein the driver is configured to launch the surface acoustic wave (SAW) in the substrate with an alternating electrical voltage.

3. The subwavelength electromagnetic antenna of claim 1, wherein the array of nanomagnets define an emitting area (A) and, when driven, radiate an electromagnetic wave of a wavelength ($\lambda$), wherein the ratio $A/\lambda^2$ is on the order of $10^{-9}$.

4. The subwavelength electromagnetic antenna of claim 1, wherein the magnetostrictive nanomagnets are each 100-500 nm in length and/or 100-500 nm in width.

5. The subwavelength electromagnetic antenna of claim 1, wherein a greater number of magnetostrictive nanomagnets in the array corresponds with a greater emitted signal strength.

* * * * *